(12) United States Patent
Yu et al.

(10) Patent No.: US 12,062,693 B2
(45) Date of Patent: Aug. 13, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Jia-Ni Yu, New Taipei (TW); Kuo-Cheng Chiang, Hsinchu (TW); Mao-Lin Huang, Hsinchu (TW); Lung-Kun Chu, New Taipei (TW); Chung-Wei Hsu, Hsinchu (TW); Chih-Hao Wang, Hsinchu (TW); Kuan-Lun Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 470 days.

(21) Appl. No.: 17/459,748

(22) Filed: Aug. 27, 2021

(65) Prior Publication Data

US 2023/0062026 A1  Mar. 2, 2023

(51) Int. Cl.

| H01L 29/06 | (2006.01) |
| H01L 21/8234 | (2006.01) |
| H01L 29/423 | (2006.01) |
| H01L 29/66 | (2006.01) |
| H01L 29/786 | (2006.01) |

(52) U.S. Cl.
CPC .. *H01L 29/0673* (2013.01); *H01L 21/823418* (2013.01); *H01L 21/823481* (2013.01); *H01L 29/0649* (2013.01); *H01L 29/42392* (2013.01); *H01L 29/66742* (2013.01); *H01L 29/78618* (2013.01)

(58) Field of Classification Search
CPC ....... H01L 29/42392; H01L 21/823481; H01L 21/823878; H01L 21/76–765
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

*Primary Examiner* — Amar Movva
(74) *Attorney, Agent, or Firm* — NZ CARR LAW OFFICE

(57) ABSTRACT

A semiconductor device structure, along with methods of forming such, are described. The structure includes a first gate electrode layer, a second gate electrode layer disposed over and aligned with the first gate electrode layer, and a gate isolation structure disposed between the first gate electrode layer and the second gate electrode layer. The gate isolation structure includes a first surface and a second surface opposite the first surface. At least a portion of the first surface is in contact with the first gate electrode layer. The second surface includes a first material and a second material different from the first material, and at least a portion of the second surface is in contact with the second gate electrode layer.

20 Claims, 23 Drawing Sheets

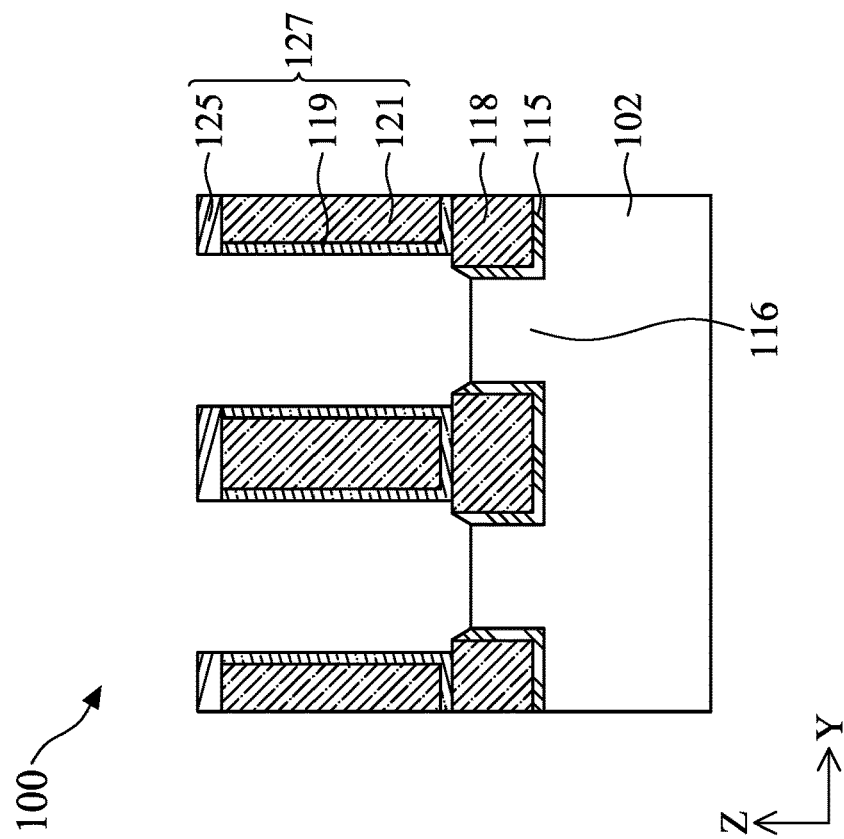
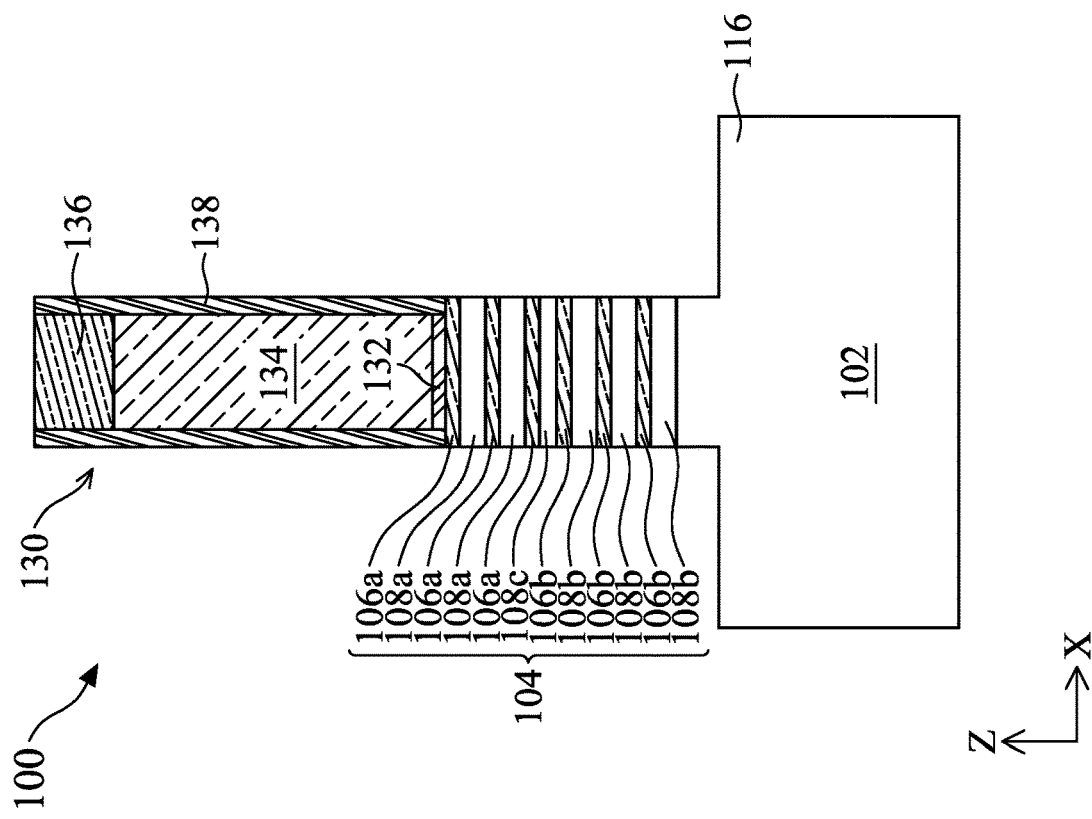
FIG. 9B
FIG. 9A

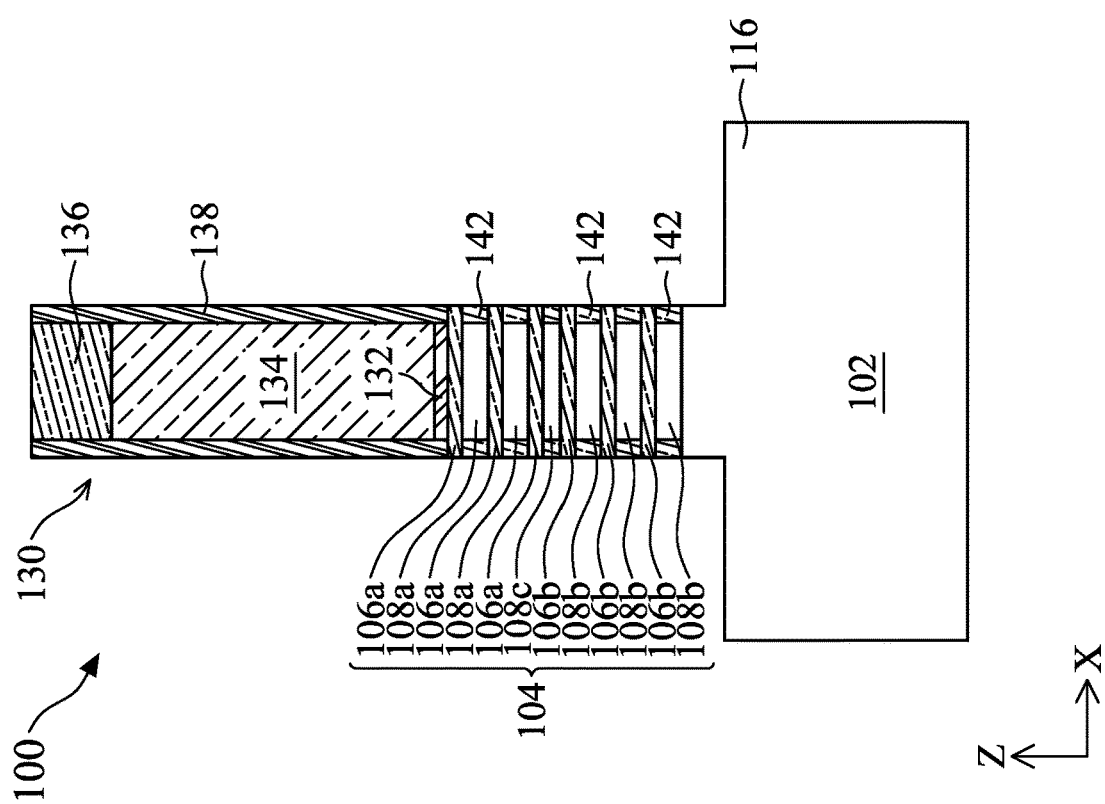
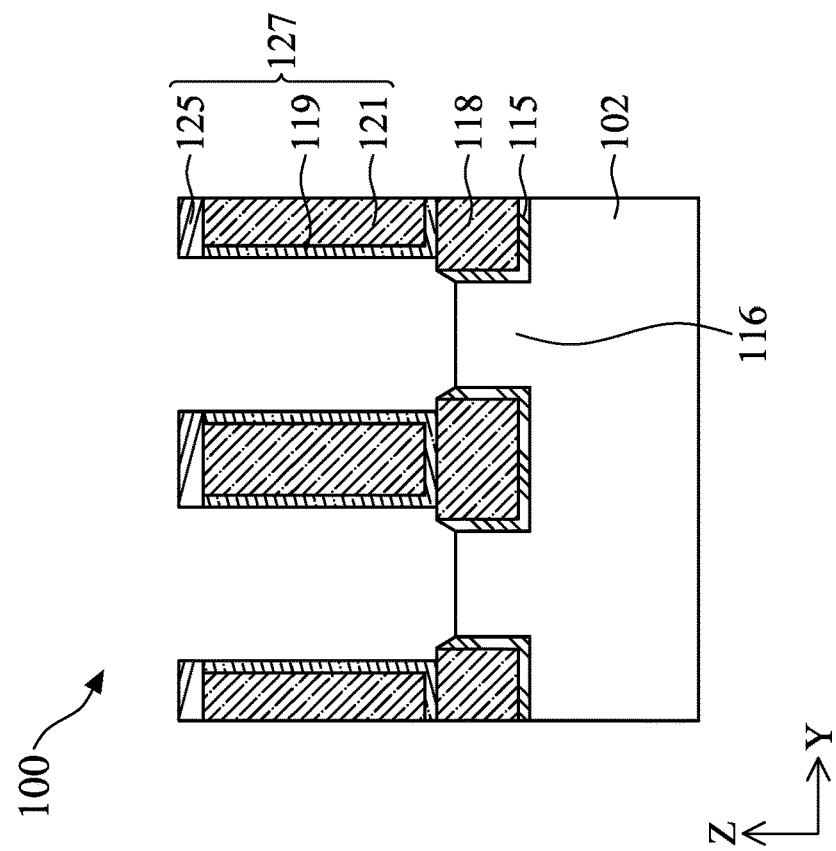
FIG. 10A
FIG. 10B

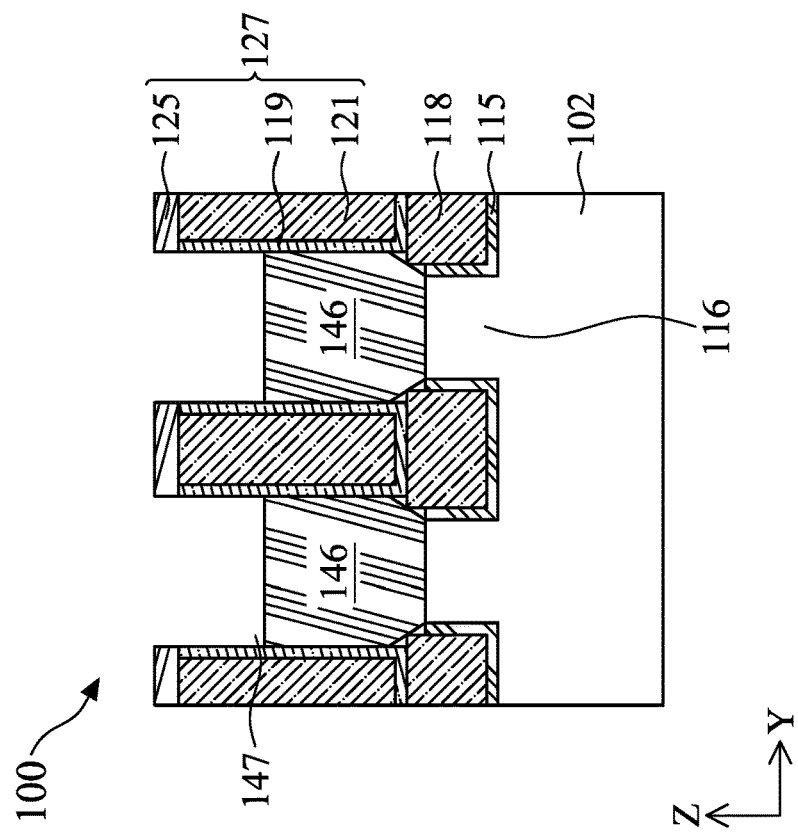
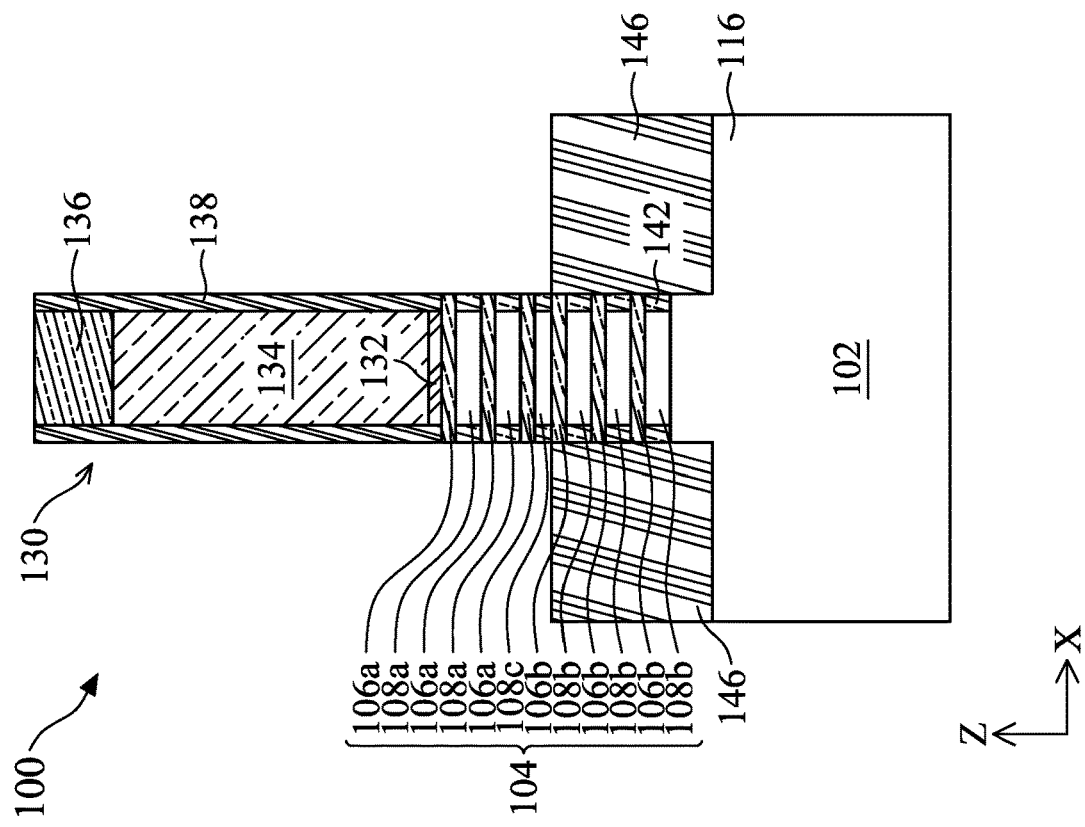
FIG. 11A
FIG. 11B

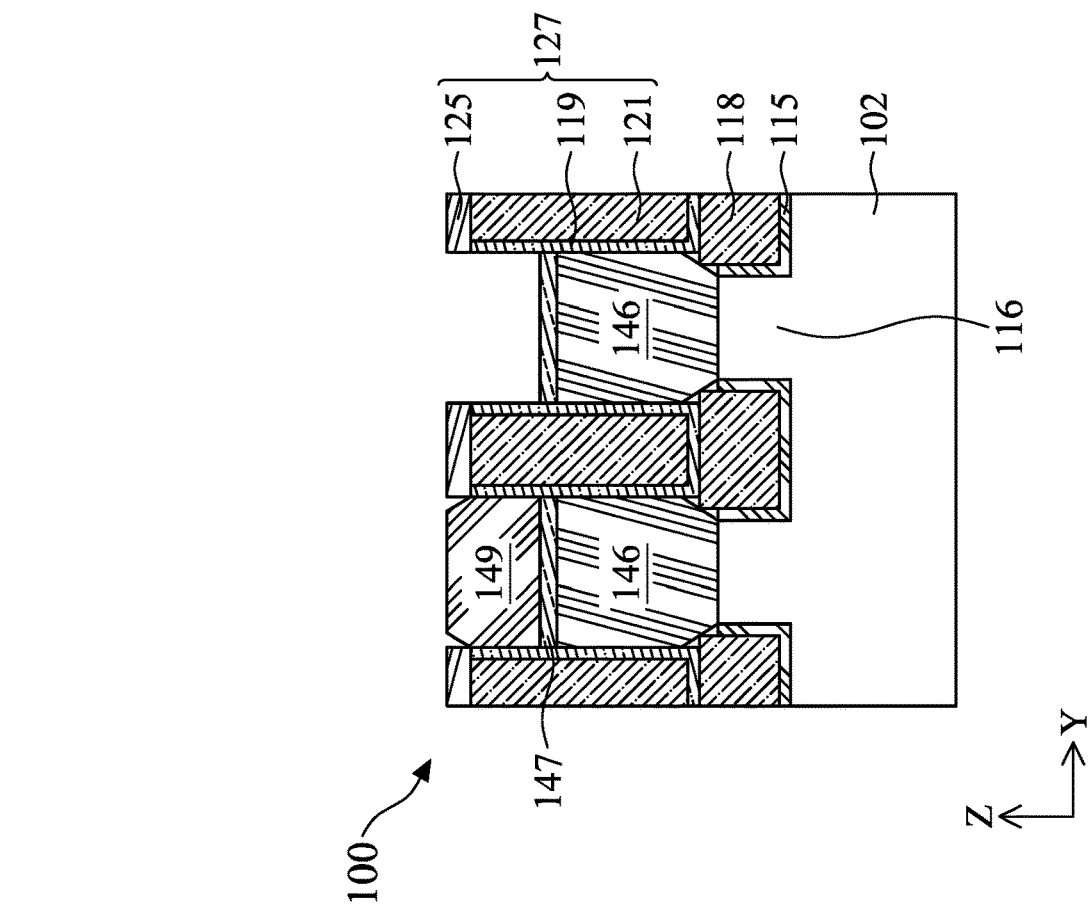
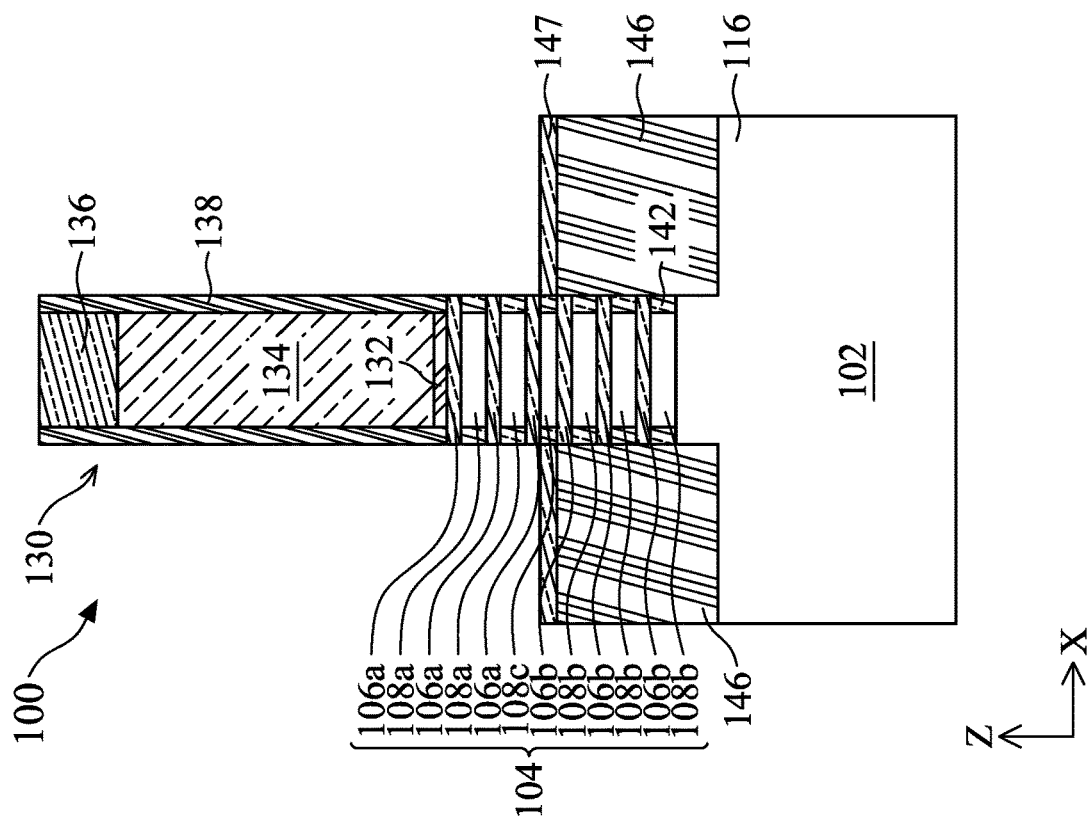
FIG. 12A
FIG. 12B

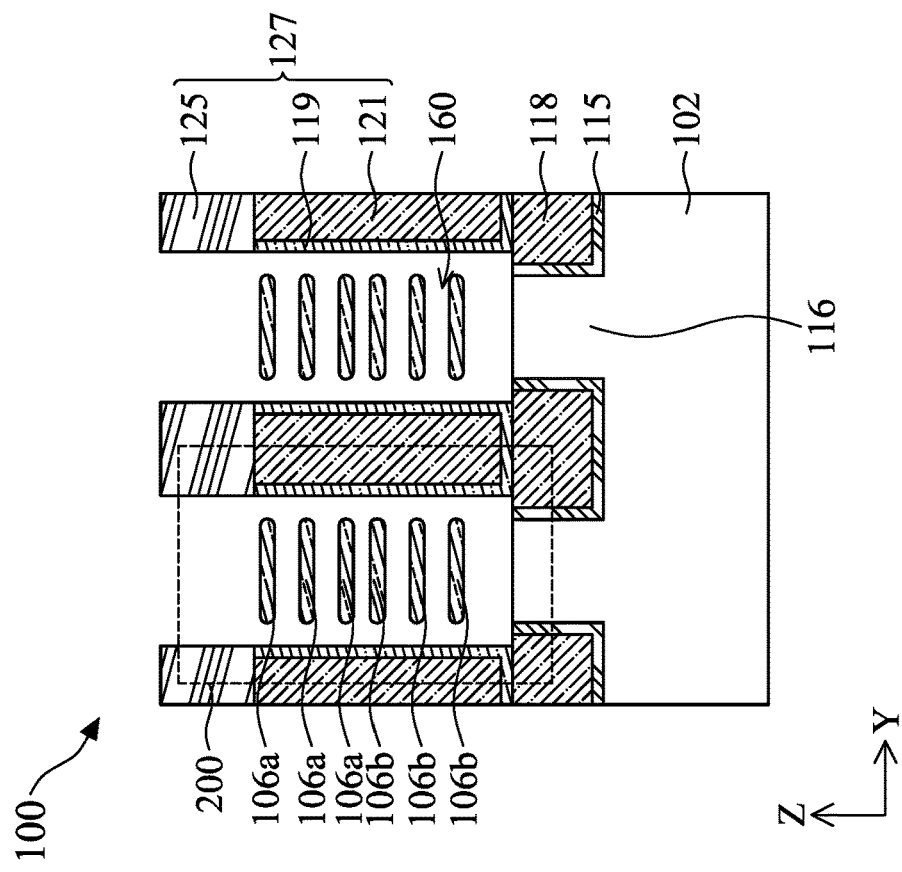
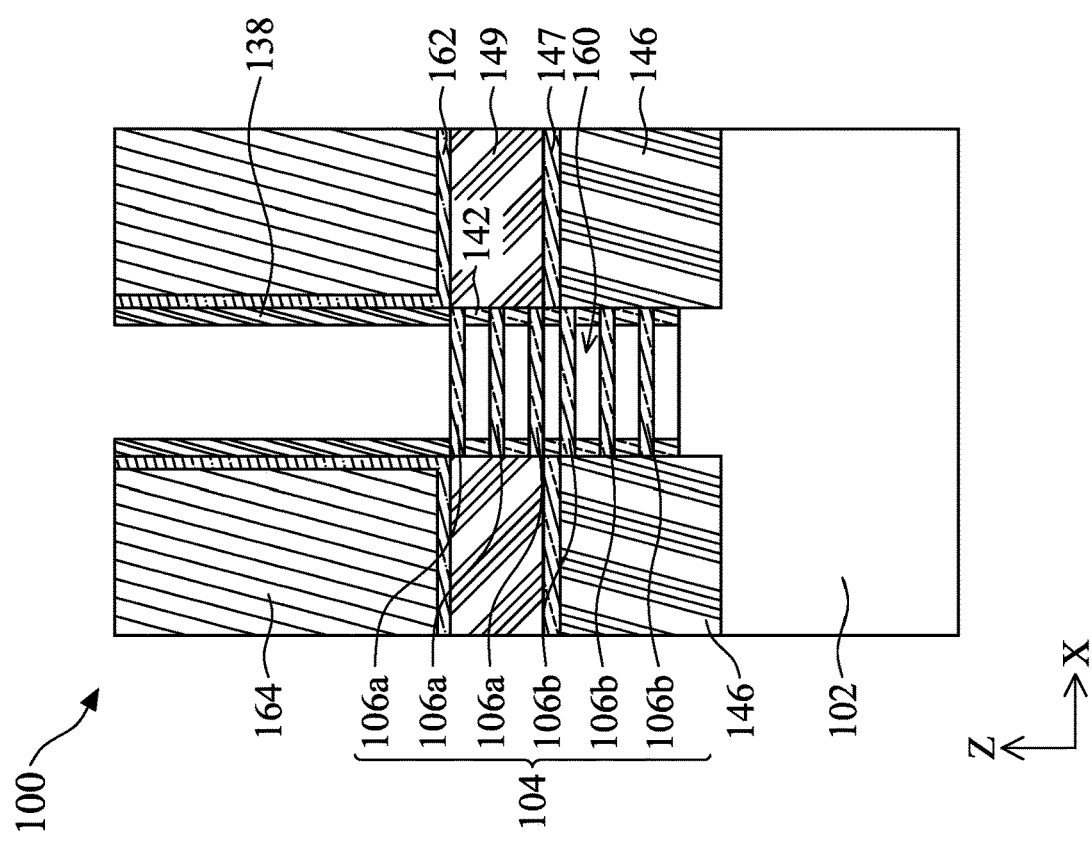
FIG. 15B
FIG. 15A

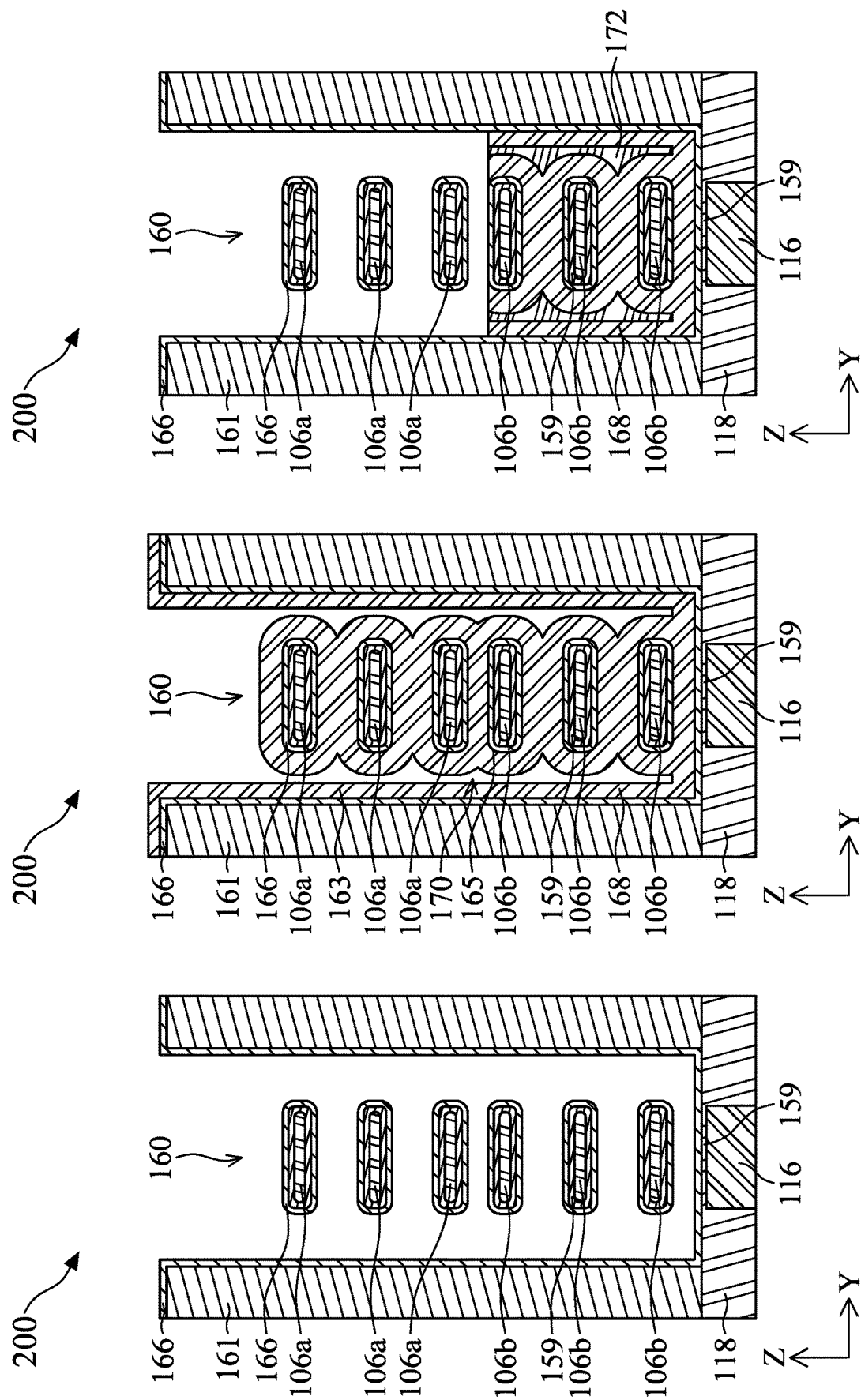

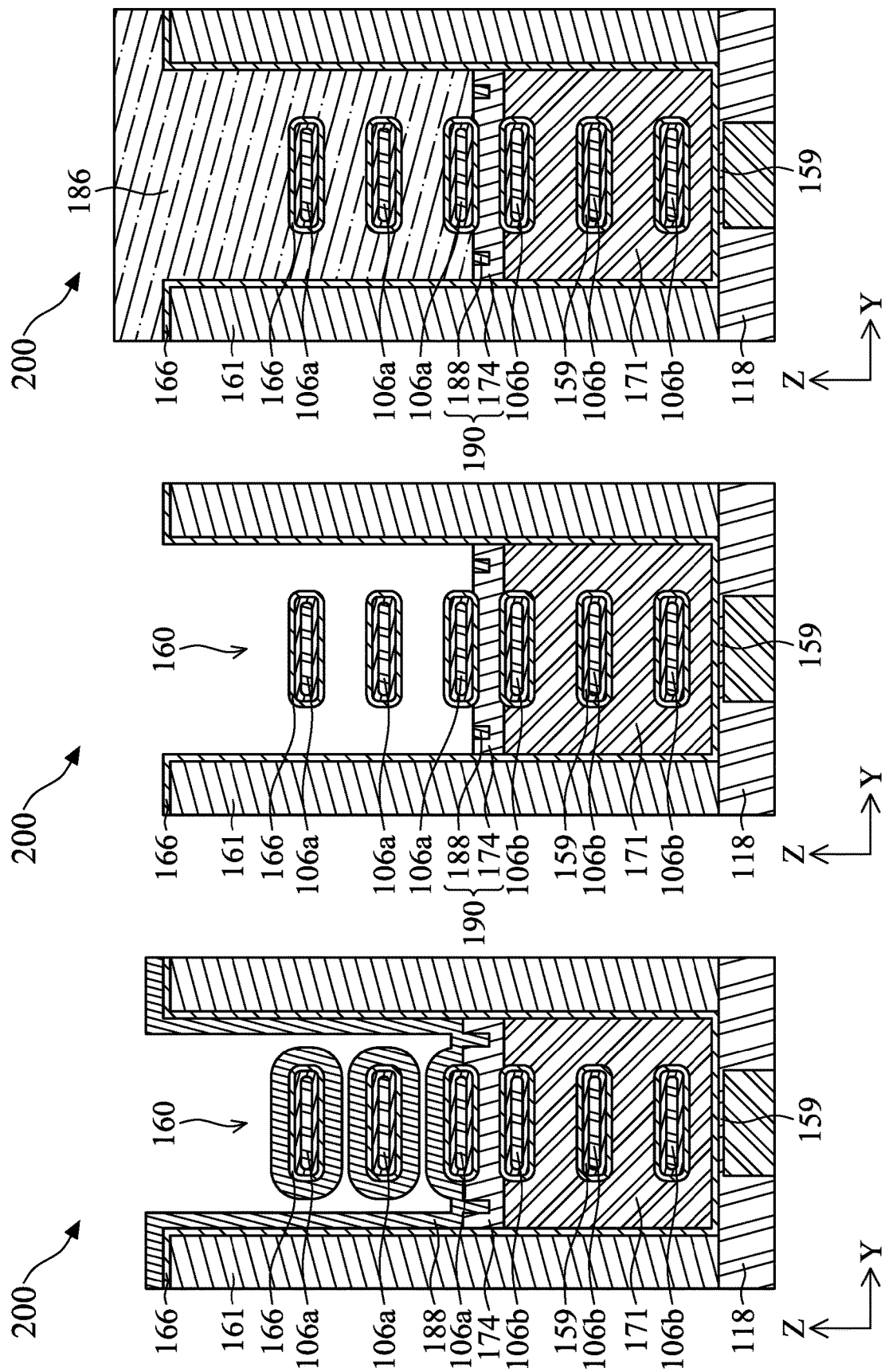

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel region are surrounded by a gate electrode, which allows for fuller depletion in the channel region and results in less short-channel effects due to steeper sub-threshold current swing (SS) and smaller drain induced barrier lowering (DIBL). As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-15A are cross-sectional side views of various stages of manufacturing the semiconductor device structure taken along line A-A of FIG. 8, in accordance with some embodiments.

FIGS. 9B-14B are cross-sectional side views of various stages of manufacturing the semiconductor device structure taken along line B-B of FIG. 8, in accordance with some embodiments.

FIG. 15B is a cross-sectional side view of a stage of manufacturing the semiconductor device structure taken along line C-C of FIG. 8, in accordance with some embodiments.

FIGS. 16A-16J are enlarged views of a region of FIG. 15B showing various stages of manufacturing the semiconductor device structure, in accordance with some embodiments.

FIGS. 17A-17C are enlarged views of the region of FIG. 15B showing various stages of manufacturing the semiconductor device structure, in accordance with alternative embodiments.

DETAILED DESCRIPTION

Figure 1:
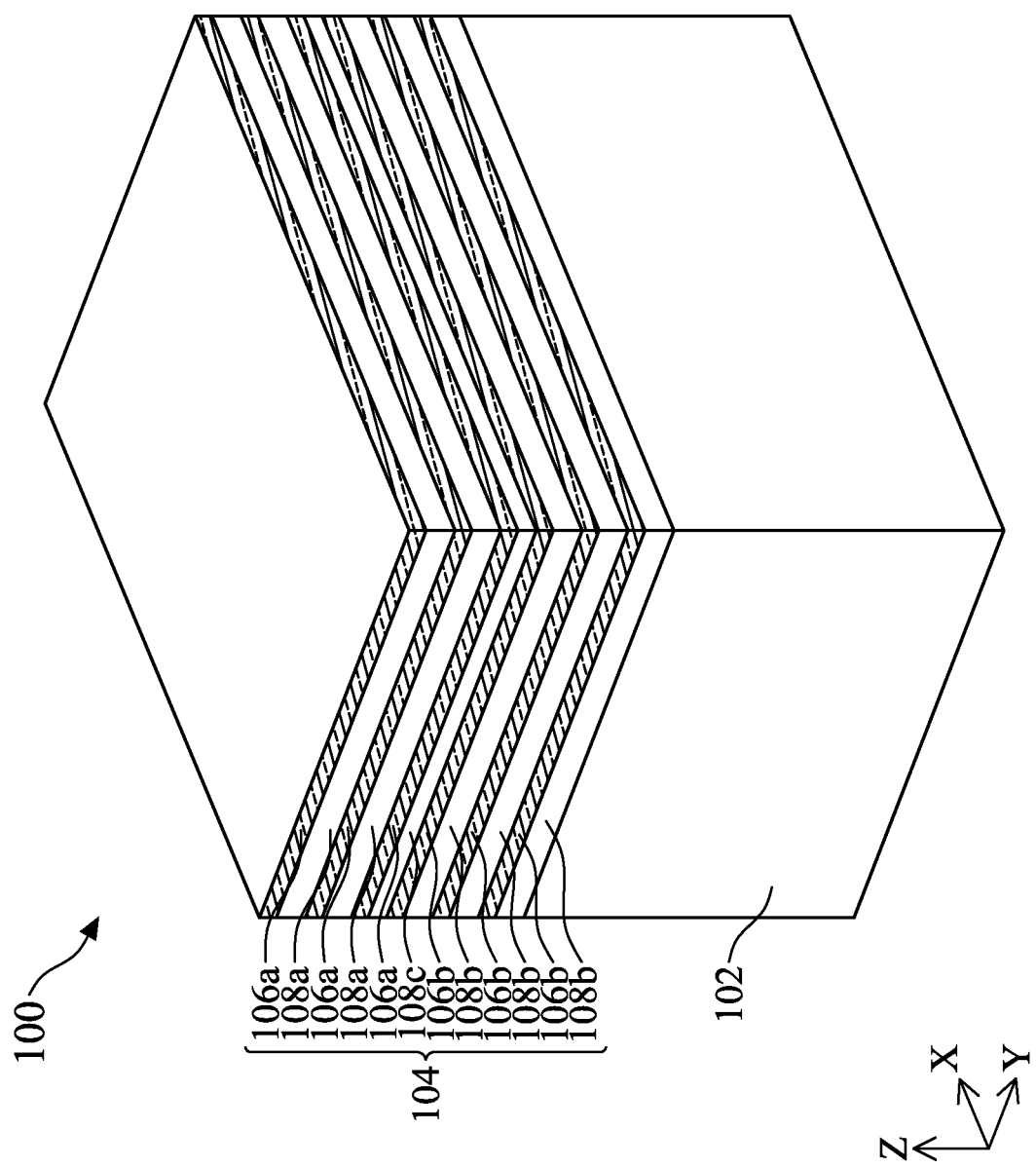
FIGS. 1-8 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-20 show exemplary sequential processes for manufacturing a semiconductor device structure 100, in accordance with some embodiments. It is understood that additional operations can be provided before, during, and after processes shown by FIGS. 1-20 and some of the operations described below can be replaced or eliminated, for additional embodiments of the method. The order of the operations/processes may be interchangeable.

FIGS. 1-8 are perspective views of various stages of manufacturing a semiconductor device structure, in accordance with some embodiments. As shown in FIG. 1, a stack of semiconductor layers 104 is formed over a substrate 102. The substrate 102 may be a semiconductor substrate. In some embodiments, the substrate 102 includes a single crystalline semiconductor layer on at least the surface of the substrate 102. The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 102 is made of Si. In some embodiments, the substrate 102 is a silicon-on-insulator (SOI) substrate, which includes an insulating layer (not shown) disposed between two silicon layers. In one aspect, the insulating layer is an oxide.

The substrate 102 may include one or more buffer layers (not shown) on the surface of the substrate 102. The buffer layers can serve to gradually change the lattice constant from that of the substrate to that of the source/drain (S/D) regions to be grown on the substrate 102. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example boron for a p-type field effect transistor FET (PFET) and phosphorus for an n-type FET (NFET).

The stack of semiconductor layers 104 includes first semiconductor layers 106 (106a, 106b) and second semiconductor layers 108 (108a, 108b, 108c). The first semiconductor layers 106 and the second semiconductor layers 108 are made of semiconductor materials having different etch selectivity and/or oxidation rates. In some embodiments, either of the first and second semiconductor layers 106, 108 may be or include materials such as Si, Ge, SiC, GeAs, GaP, InP, InAs, InSb, GaAsP, AlInAs, AlGaAs, InGaAs, GaInP, GaInAsP, or other suitable material. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanosheet channel(s) of the semiconductor device structure 100 at a later stage. The semiconductor device structure 100 may include a nanosheet transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below.

In some embodiments, the semiconductor device structure 100 includes a complementary FET (CFET), and the first semiconductor layers 106 includes channels for two or more nanosheet FETs. For example, the first semiconductor layers 106b define the channels of a first FET, such as a PFET, and the first semiconductor layers 106a define the channels of a second FET, such as an NFET. The thickness of the first semiconductor layers 106a, 106b is chosen based on device performance considerations. In some embodiments, each first semiconductor layer 106a, 106b has a thickness ranging from about 4 nanometers (nm) to about 10 nm. The first semiconductor layer 106a may have the same or a different thickness as the thickness of the first semiconductor layer 106b.

The second semiconductor layers 108a, 108b may eventually be removed and serve to define spaces for a gate stack to be formed therein. The thickness is chosen based on device performance considerations. In some embodiments, each second semiconductor layer 108a, 108b has a thickness ranging from about 8 nm to about 15 nm. The second semiconductor layer 108c may eventually be removed and serve to define a space for an isolation stack to be formed therein. The thickness of the second semiconductor layer 108c may be less than that of the second semiconductor layers 108a, 108b. In some embodiments, the second semiconductor layer 108c has a thickness ranging from about 3 nm to about 10 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

Figure 2:
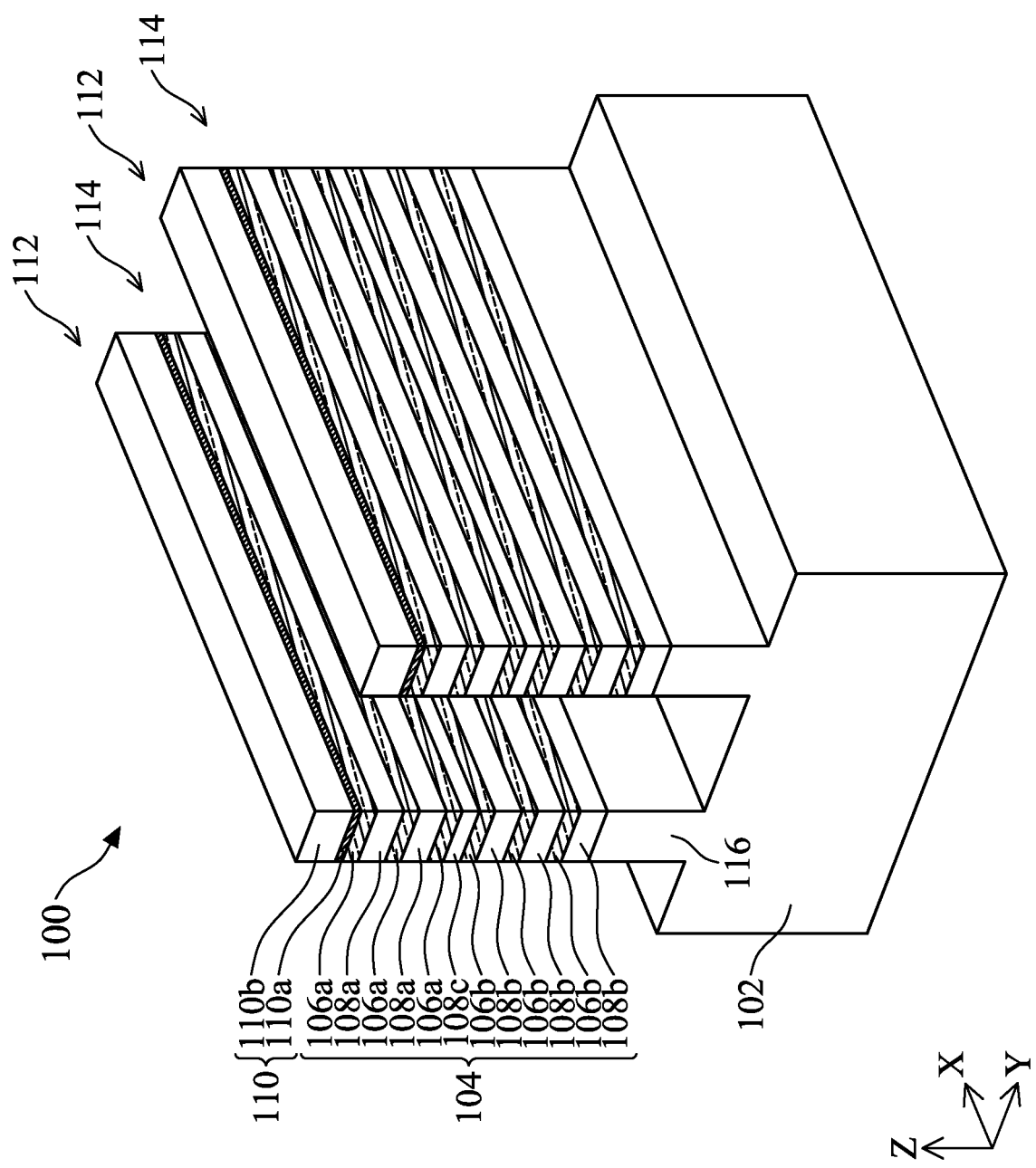

FIG. 2 is a perspective view of one of the various stages of manufacturing the semiconductor device structure 100, in accordance with some embodiments. As shown in FIG. 2, fins 112 are formed. In some embodiments, each fin 112 includes a substrate portion 116 formed from the substrate 102, a portion of the stack of semiconductor layers 104, and a portion of a mask structure 110. The mask structure 110 is formed over the stack of semiconductor layers 104 prior to forming the fins 112. The mask structure 110 may include an oxygen-containing layer 110a and a nitrogen-containing layer 110b. The oxygen-containing layer 110a may be a pad oxide layer, such as a $SiO_2$ layer. The nitrogen-containing layer 110b may be a pad nitride layer, such as $Si_3N_4$. The mask structure 110 may be formed by any suitable deposition process, such as chemical vapor deposition (CVD) process.

The fins 112 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 112 by etching the stack of semiconductor layers 104 and the substrate 102. The etch process can include dry etch, wet etch, reactive ion etch (RIE), and/or other suitable processes. As shown in FIG. 2, two fins 112 are formed, but the number of the fins is not limited to two.

In some embodiments, the fins 112 may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 102 and layers formed thereupon, while an etch process forms trenches 114 in unprotected regions through the mask structure 110, the stack of semiconductor layers 104, and into the substrate 102, thereby leaving the extending fins 112. The trenches 114 may be etched using a dry etch (e.g., RIE), a wet etch, and/or combination thereof.

Figure 3:
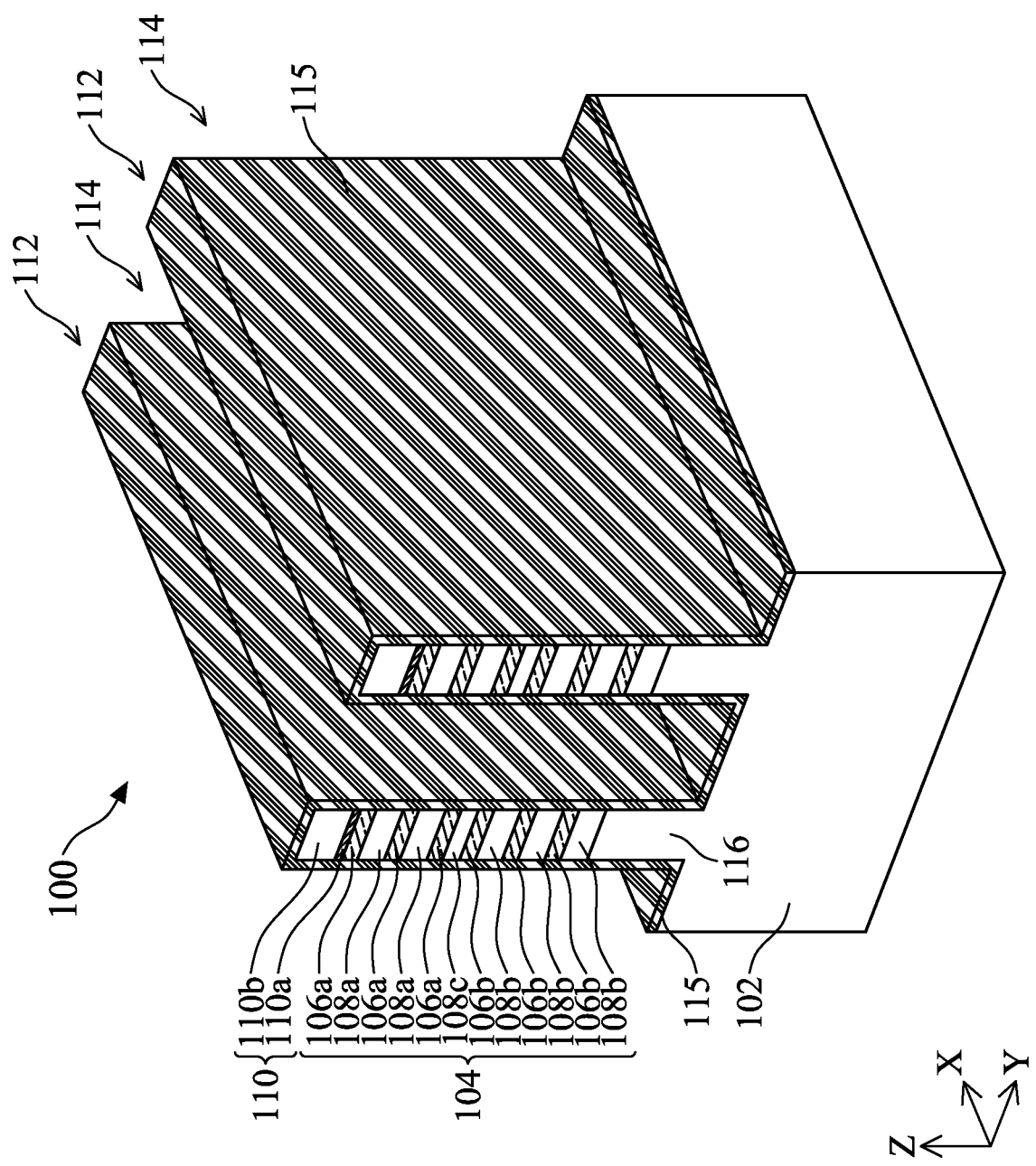

FIG. 3 is a perspective view of one of the various stages of manufacturing the semiconductor device structure 100, in accordance with some embodiments. As shown in FIG. 3, a liner 115 is formed over the substrate 102 and the fins 112. In some embodiments, an optional liner (not shown) may be formed on the substrate 102 and fins 112, and the liner 115 is formed on the optional liner. The liner 115 may be made of a semiconductor material, such as Si. In some embodiments, the liner 115 is made of the same material as the substrate 102. The liner 115 may be a conformal layer and may be formed by a conformal process, such as an atomic layer deposition (ALD) process. The term "conformal" may be used herein for ease of description upon a layer having substantial same thickness over various regions.

Figure 4:
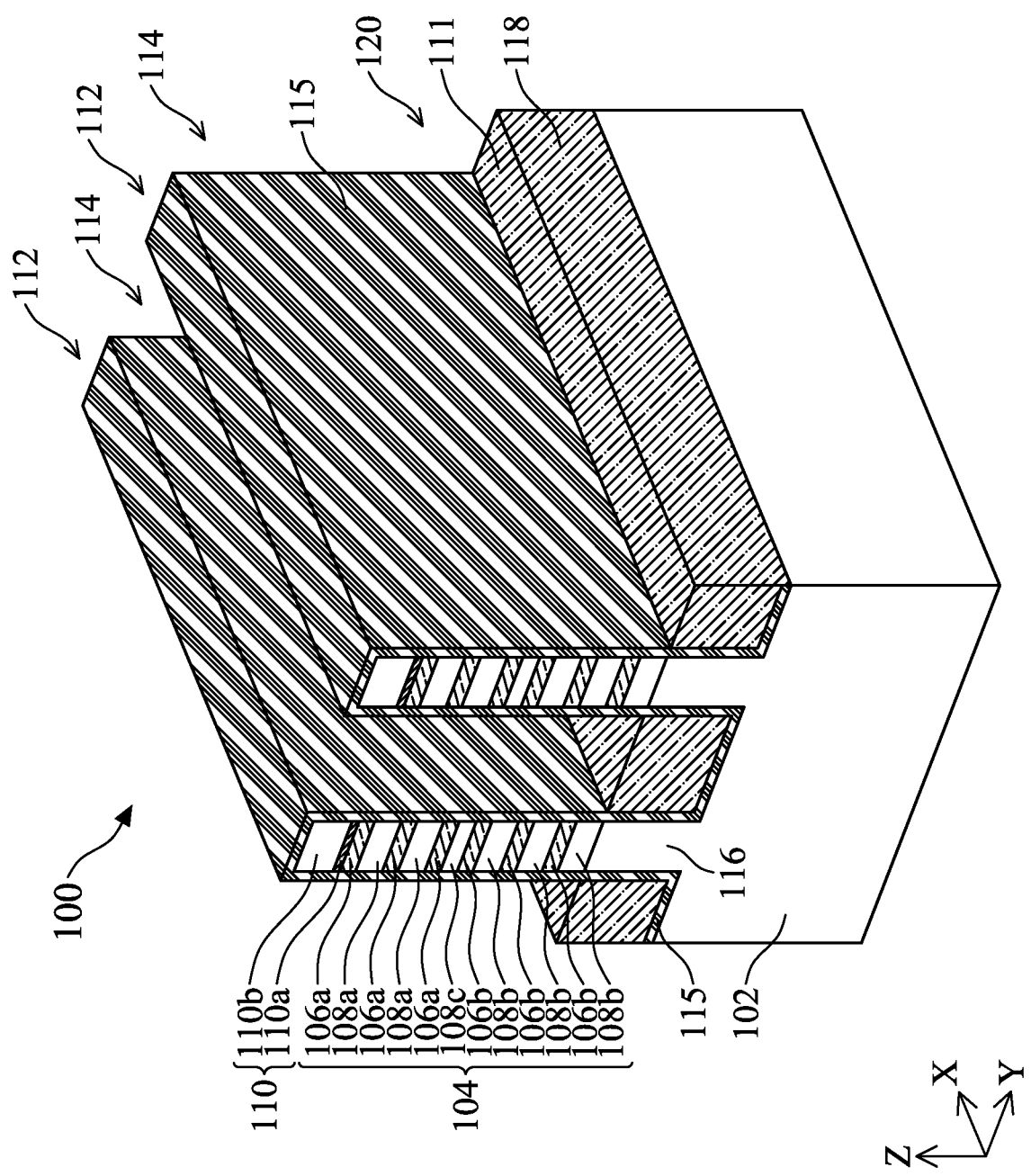

FIG. 4 is a perspective view of one of the various stages of manufacturing the semiconductor device structure 100, in accordance with some embodiments. As shown in FIG. 4, an insulating material 118 is formed on the substrate 102. The insulating material 118 may be made of an oxygen-containing material, such as silicon oxide or fluorine-doped silicate glass (FSG); a nitrogen-containing material, such as silicon nitride, silicon oxynitride (SiON), SiOCN, SiCN; a low-k dielectric material; or any suitable dielectric material. The insulating material 118 may be formed by first forming an insulating material over the substrate 102 so that the fins 112 are embedded in the insulating material. The insulating material may be formed by any suitable method, such as low-pressure chemical vapor deposition (LPCVD), plasma enhanced CVD (PECVD) or flowable CVD (FCVD). Then, a planarization operation, such as a chemical mechanical polishing (CMP) process and/or an etch-back process, is performed such that the tops of the fins 112 (e.g., the liner 115) are exposed from the insulating material. Next, the insulating material may be recessed by removing a portion of the insulating material located between adjacent fins 112 to form the insulating material 118. The insulating material 118 partially fills the trenches 114. The insulating material 118 may be the shallow trench isolation (STI) 120. The insulating material 118 includes a top surface 111 that may be level with or below a surface of the second semiconductor layers 108b in contact with the substrate portions 116 of the substrate 102.

Figure 5:
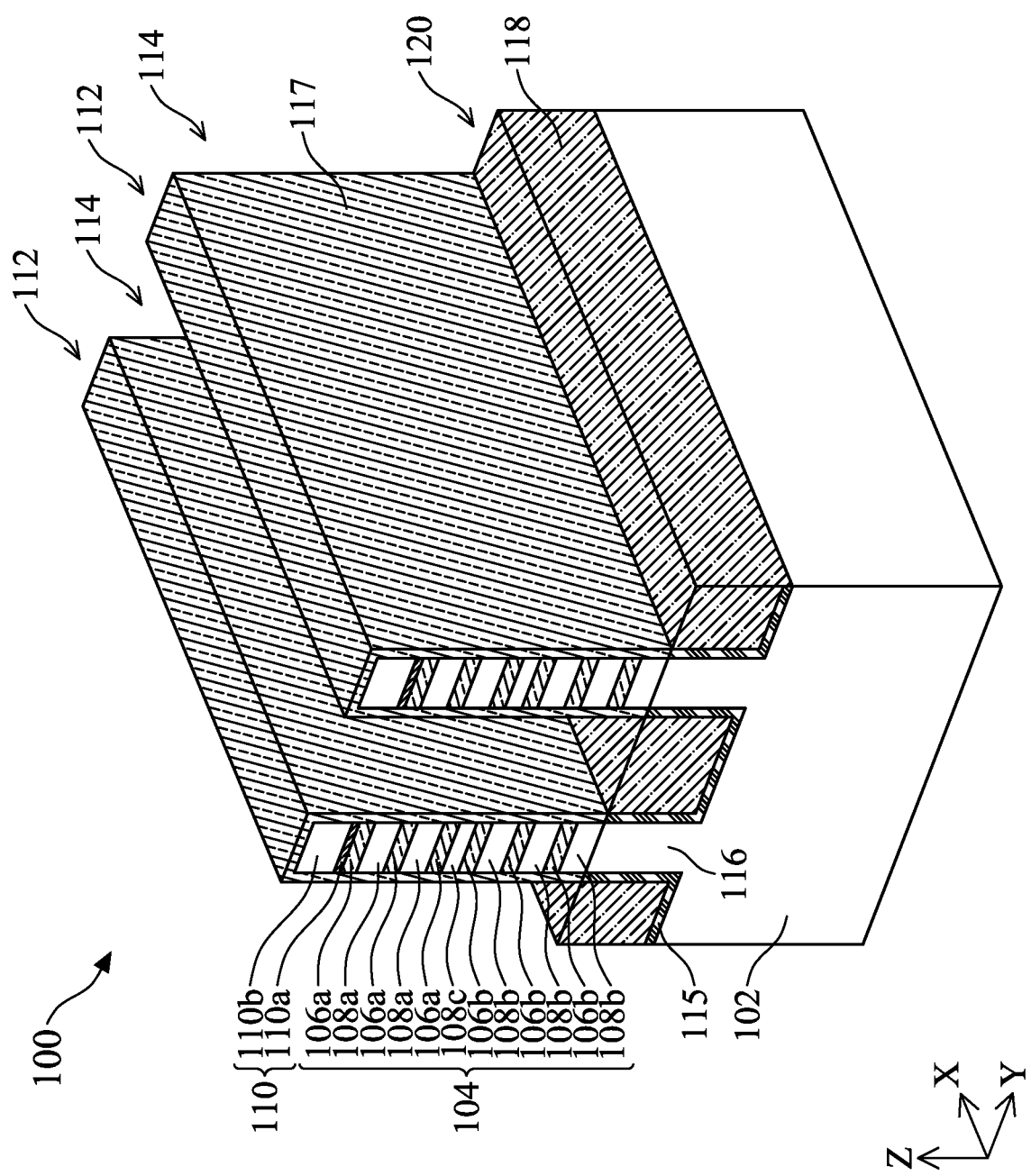

Next, as shown in FIG. 5, a cladding layer 117 is formed on the exposed surface of the liner 115. The liner 115 may be diffused into the cladding layer 117 during the formation of the cladding layer 117. Thus, in some embodiments where the optional liner does not exist, the cladding layer 117 is in contact with the stack of semiconductor layers 104, as shown in FIG. 5. In some embodiments, the cladding layer 117 includes a semiconductor material. The cladding layer 117 may grow on semiconductor materials but not on dielectric materials. For example, the cladding layer 117 includes SiGe and is grown on the Si of the liner 115 but not on the dielectric material of the insulating material 118. In some embodiments, the cladding layer 117 and the second semiconductor layers 108a, 108b, 108c include the same material having the same etch selectivity. For example, the cladding layer 117 and the second semiconductor layers 108a, 108b, 108c include SiGe. The cladding layer 117 and the second semiconductor layers 108a, 108b, 108c may be removed subsequently to create spaces for the gate stack and isolation stack.

Figure 6:
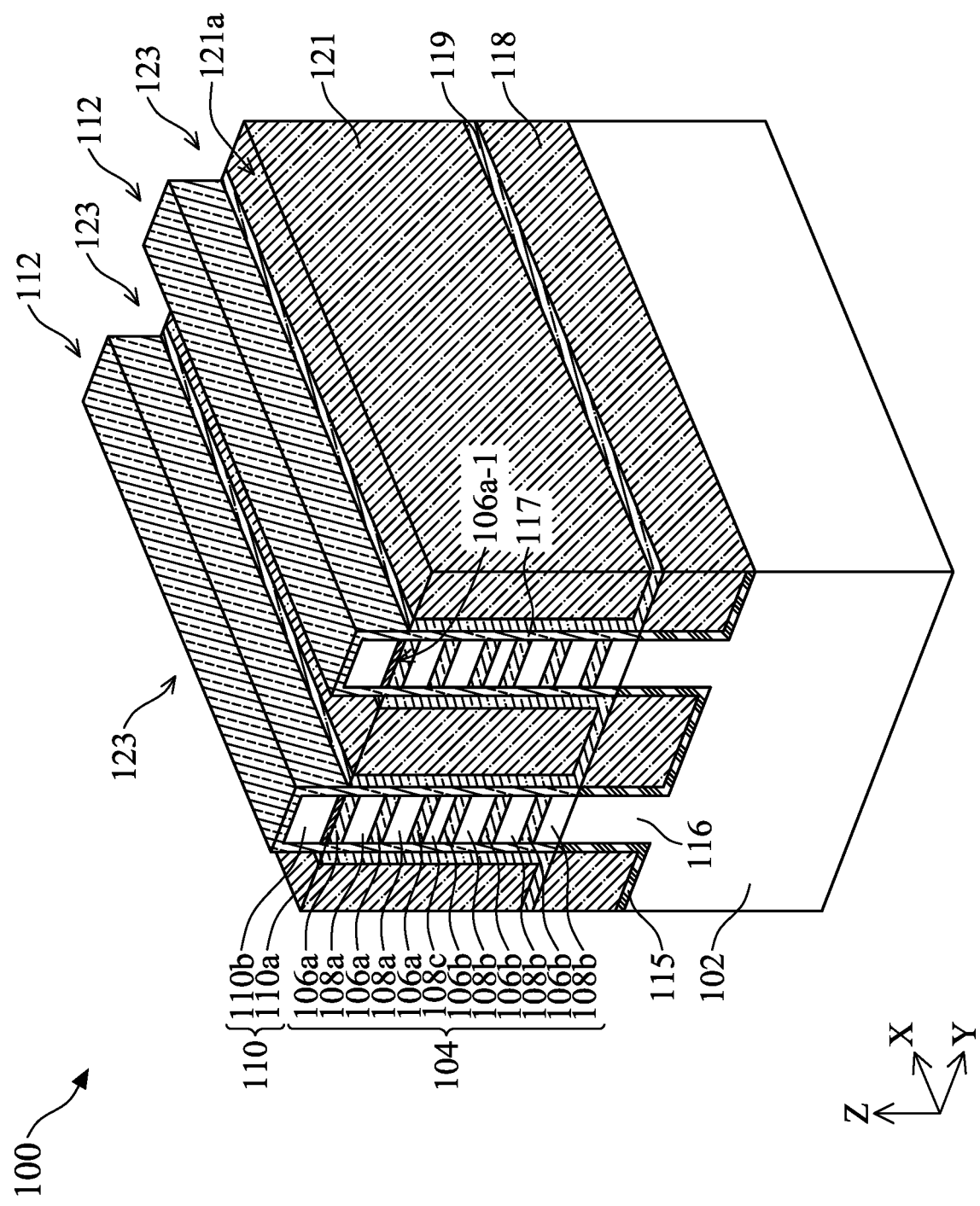

Next, as shown in FIG. 6, a liner 119 is formed on the cladding layer 117 and the insulating material 118. The liner 119 may include a low-k dielectric material (e.g., a material having a k value less than 7), such as $SiO_2$, SiN, SiCN, SiOC, or SiOCN. The liner 119 may be formed by a conformal process, such as an ALD process. A dielectric material 121 is formed in the trenches 114 (FIG. 5) and on the liner 119, as shown in FIG. 6. The dielectric material 121 may be an oxygen-containing material, such as an oxide, and may be formed by FCVD. The oxygen-containing material may have a K value less than about 7, for example less than about 3. In some embodiments, the dielectric material 121 includes the same material as the insulating material 118. The liner 119 may have a thickness ranging from about 1 nm to about 6 nm. The liner 119 may function as a shell to protect the dielectric material 121 during subsequent removal of the cladding layer 117. Thus, if the thickness of the liner 119 is less than about 1 nm, the dielectric material 121 may not be sufficiently protected. On the other hand, if the thickness of the liner 119 is greater than about 6 nm, the trenches 114 (FIG. 5) may be filled.

The liner 119 and the dielectric material 121 may be first formed over the fins 112, followed by a planarization process, such as a CMP process, to remove portions of the liner 119 and the dielectric material 121 formed over the fins 112. The liner 119 and the dielectric material 121 may be further recessed to the level of the topmost first semiconductor layer 106a, as shown in FIG. 6. For example, in some embodiments, after the recess process, the dielectric material 121 may include a top surface 121a that is substantially level with a top surface 106a-1 of the topmost first semiconductor layer 106a. The top surface 106a-1 of the topmost first semiconductor layer 106a may be in contact with the mask structure 110, such as in contact with the oxygen-containing layer 110a. The liner 119 may be recessed to the same level as the dielectric material 121. The recess of the liners 119 and the dielectric materials 121 may be performed by any suitable process, such as dry etch, wet etch, or a combination thereof. In some embodiments, a first etch process may be performed to recess the dielectric material 121 followed by a second etch process to recess the liner 119. The etch processes may be selective etch processes that do not remove the semiconductor material of the cladding layer 117. As a result of the recess process, trenches 123 are formed between the fins 112.

Figure 7:
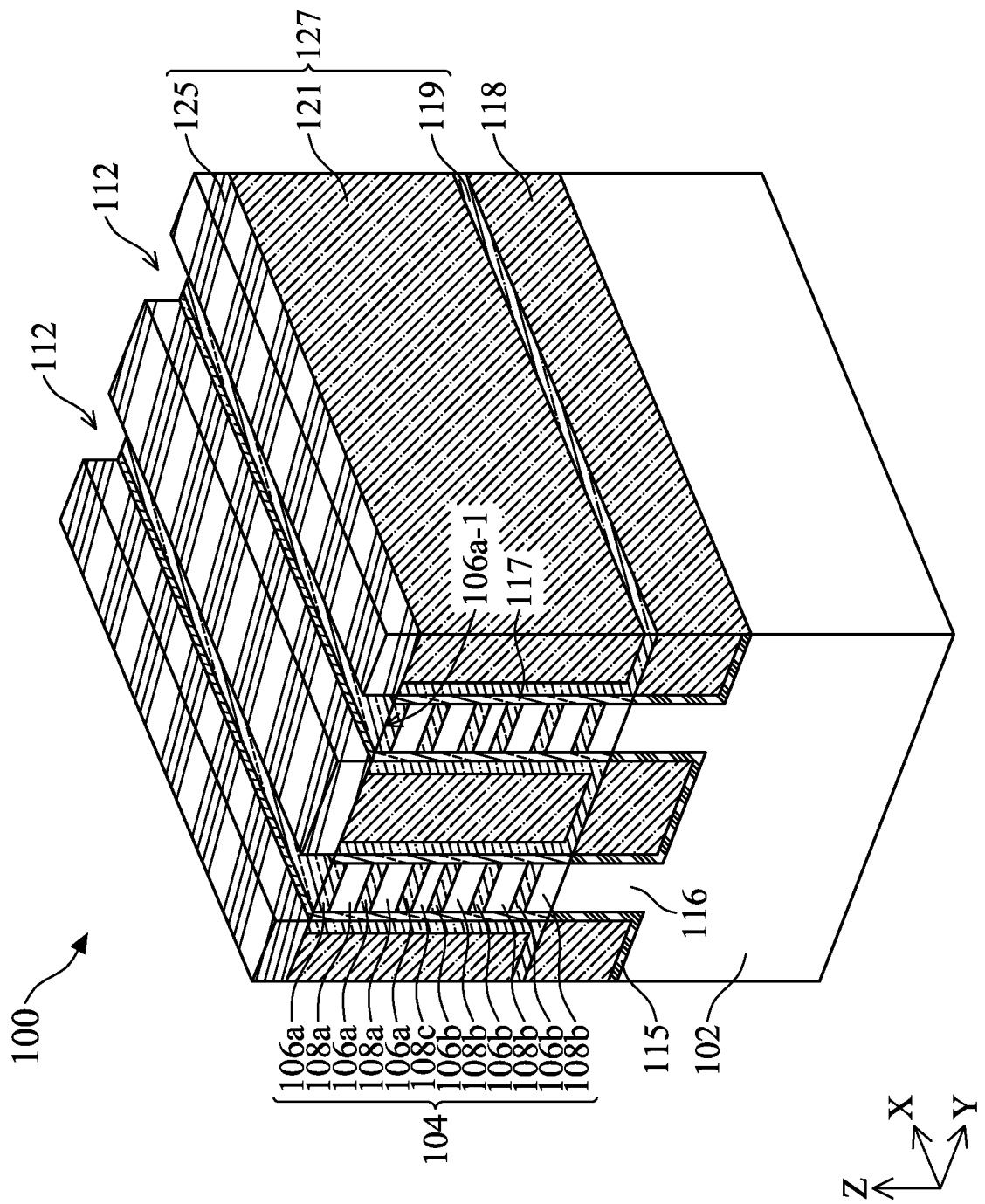

A dielectric material 125 is formed in the trenches 123 (FIG. 6) and on the dielectric material 121 and the liner 119, as shown in FIG. 7. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 904 includes a high-k dielectric material (e.g., a material having a k value greater that of silicon dioxide). The dielectric material 125 may be formed by any suitable process, such as a CVD, PECVD, FCVD, or ALD process. The liner 119, the dielectric material 121, and the dielectric material 125 together may be referred to as a dielectric feature 127. The dielectric feature 127 may be a dielectric fin that separates adjacent source/drain (S/D) epitaxial features and adjacent gate electrode layers.

The cladding layers 117 are recessed, and the mask structures 110 are removed to expose the top surfaces 106a-1 of the topmost first semiconductor layers 106a, as shown in FIG. 7. The recess of the cladding layers 117 may be performed by any suitable process, such as dry etch, wet etch, or a combination thereof. The recess process may be controlled so that the remaining cladding layers 117 are substantially at the same level as the top surface 106*a*-1 of the topmost first semiconductor layer 106*a* in the stack of semiconductor layers 104. The etch process may be a selective etch process that does not remove the dielectric material 125. The removal of the mask structures 110 may be performed by any suitable process, such as dry etch, wet etch, or a combination thereof.

Figure 8:
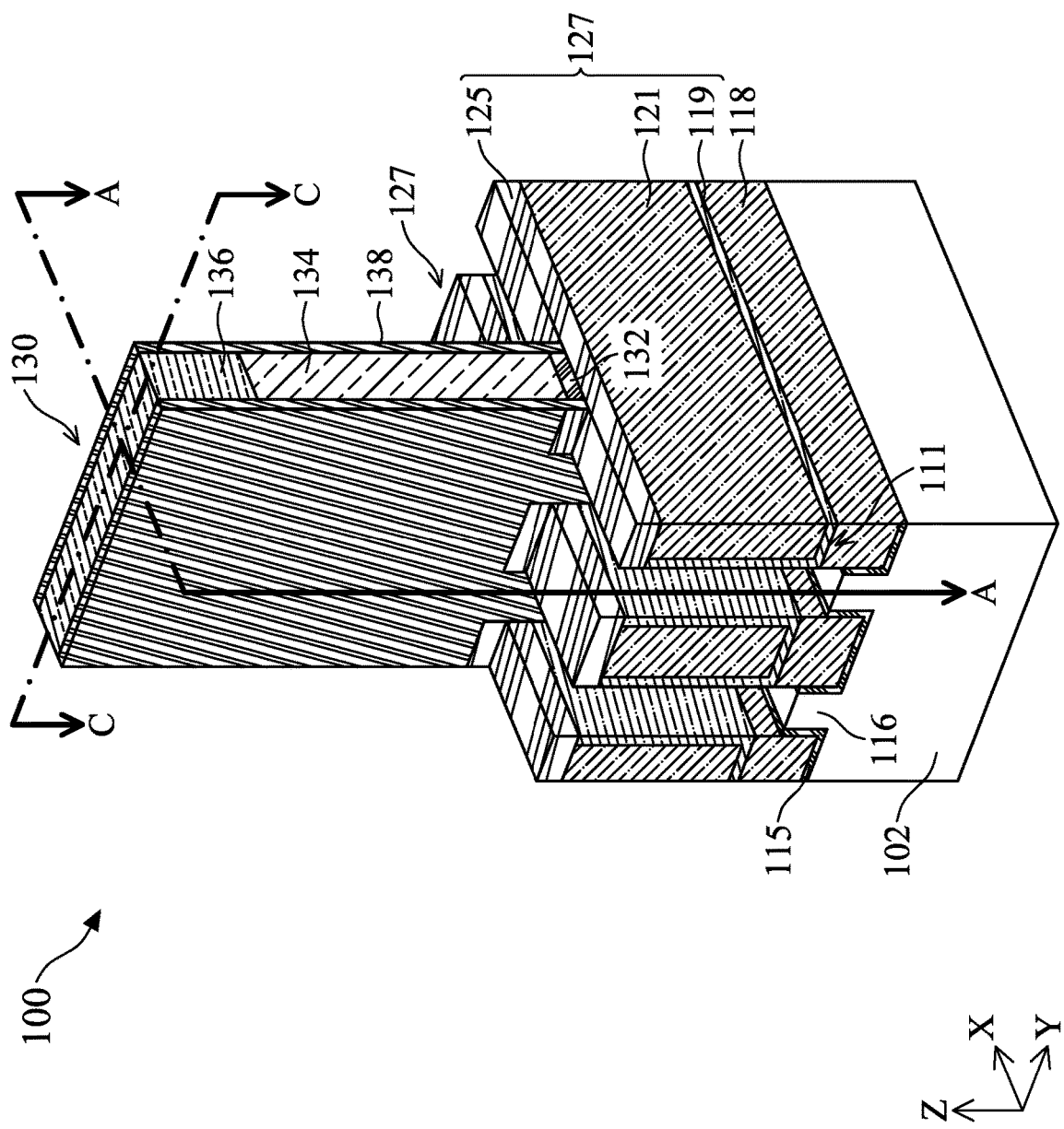

Next, as shown in FIG. 8, one or more sacrificial gate stacks 130 are formed on the semiconductor device structure 100. The sacrificial gate stack 130 may include a sacrificial gate dielectric layer 132, a sacrificial gate electrode layer 134, and a mask structure 136. The sacrificial gate dielectric layer 132 may include one or more layers of dielectric material, such as $SiO_2$, SiN, a high-k dielectric material, and/or other suitable dielectric material. In some embodiments, the sacrificial gate dielectric layer 132 includes a material different than that of the dielectric material 125. In some embodiments, the sacrificial gate dielectric layer 132 may be deposited by a CVD process, a sub-atmospheric CVD (SACVD) process, a FCVD process, an ALD process, a PVD process, or other suitable process. The sacrificial gate electrode layer 134 may include polycrystalline silicon (polysilicon). The mask structure 136 may include one or more layers of oxygen-containing layers and/or nitrogen-containing layers. In some embodiments, the sacrificial gate electrode layer 134 and the mask structure 136 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 130 may be formed by first depositing blanket layers of the sacrificial gate dielectric layer 132, the sacrificial gate electrode layer 134, and the mask structure 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 130, the stacks of semiconductor layers 104 of the fins 112 are partially exposed on opposite sides of the sacrificial gate stack 130. As shown in FIG. 8, one sacrificial gate stacks 130 are formed, but the number of the sacrificial gate stacks 130 is not limited to one. Two or more sacrificial gate stacks 130 are arranged along the X direction in some embodiments.

A spacer 138 is formed on the sidewalls of the sacrificial gate stacks 130. The spacer 138 may be formed by first depositing a conformal layer that is subsequently etched back to form spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 112, the cladding layer 117, the dielectric material 125, leaving the spacers 138 on the vertical surfaces, such as the sidewalls of sacrificial gate stack 130. The spacer 138 may be made of a dielectric material such as silicon oxide, silicon nitride, silicon carbide, silicon oxynitride, SiCN, silicon oxycarbide, SiOCN, and/or combinations thereof. In some embodiments, the spacer 138 includes multiple layers, such as main spacer walls, liner layers, and the like.

Next, exposed portions of the fins 112, exposed portions of the cladding layers 117, and exposed portions of the dielectric material 125 not covered by the sacrificial gate stacks 130 and the spacers 138 are selectively recessed by using one or more suitable etch processes, such as dry etch, wet etch, or a combination thereof. In some embodiments, exposed portions of the stacks of semiconductor layers 104 of the fins 112 are removed, exposing portions of the substrate portions 116. As shown in FIG. 8, the exposed portions of the fins 112 are recessed to a level at or below the top surface 111 of the insulating material 118. The recess processes may include an etch process that recesses the exposed portions of the fins 112 and the exposed portions of the cladding layers 117.

Figures 13A, 13B:
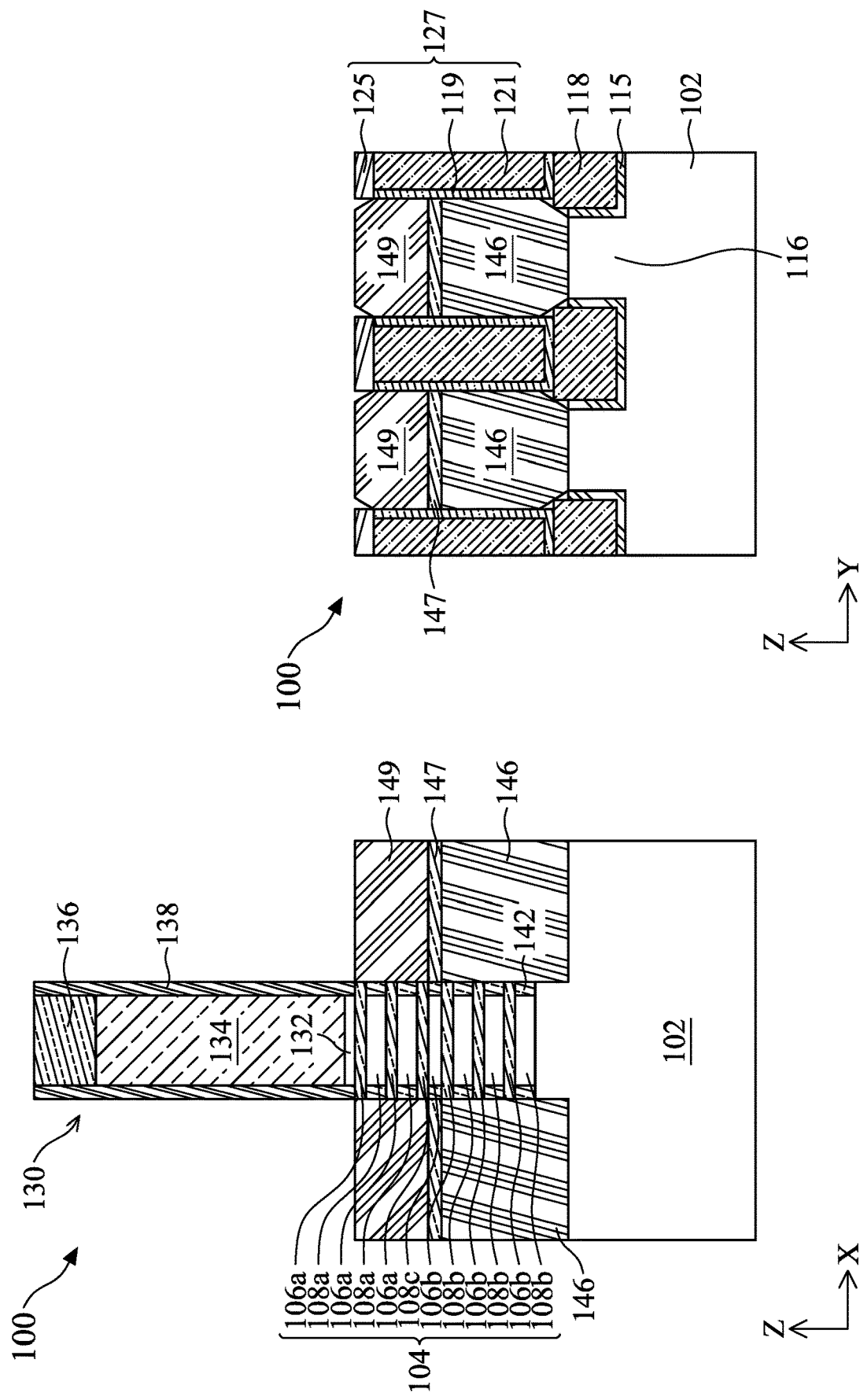

In some embodiments, the etch process may reduce the height of the exposed dielectric material 125 of the dielectric feature 127, as shown in FIG. 8. Thus, a first portion of the dielectric material 125 under the sacrificial gate stack 130 and the spacers 138 has the height greater than a height of a second portion of the dielectric material 125 located between S/D epitaxial features 146, 149 (FIG. 13B).

FIGS. 9A-15A are cross-sectional side views of various stages of manufacturing the semiconductor device structure 100 taken along line A-A of FIG. 8, in accordance with some embodiments. FIGS. 9B-14B are cross-sectional side views of various stages of manufacturing the semiconductor device structure taken along line B-B of FIG. 8, in accordance with some embodiments. FIGS. 9A and 9B show the stage of manufacturing the semiconductor device structure 100 shown in FIG. 8. At this stage, end portions of the stacks of semiconductor layers 104 under the sacrificial gate stacks 130 and the spacers 138 may have substantially flat surfaces which may be flush with corresponding spacers 138.

Next, as shown in FIG. 10A, edge portions of each second semiconductor layer 108*a*, 108*b*, 108*c*, and edge portions of the cladding layers 117 are removed. In some embodiments, the removal is a selective wet etch process. For example, in cases where the second semiconductor layers 108*a*, 108*b*, 108*c* are made of SiGe, the cladding layers 117 are made of the same material as the second semiconductor layers 108*a*, 108*b*, 108*c*, and the first semiconductor layers 106*a*, 106*b* are made of silicon, a selective wet etch using an ammonia and hydrogen peroxide mixtures (APM) may be used. As a result, edge portions of the second semiconductor layers 108*a*, 108*b*, 108*c* and edge portions of the cladding layers 117 may be removed, and the first semiconductor layers 106*a*, 106*b* are substantially unchanged. In some embodiments, the selective removal process may include SiGe oxidation followed by a $SiGeO_x$ removal.

Next, dielectric spacers 142 are formed in the spaces created by the removal of the edge portions of the second semiconductor layers 108*a*, 108*b*, 108*c* and the edge portions of the cladding layers 117, as shown in FIG. 10A. In some embodiments, the dielectric spacers 142 may be flush with the spacers 138. The dielectric spacers 142 may include a low-k dielectric material, such as SiON, SiCN, SiOC, SiOCN, or SiN. In some embodiments, the dielectric spacers 142 may be formed by first forming a conformal dielectric layer using a conformal deposition process, such as ALD, followed by an anisotropic etching to remove portions of the conformal dielectric layer other than the dielectric spacers 142. The dielectric spacers 142 may be protected by the first semiconductor layers 106*a*, 106*b* during the anisotropic etching process.

Next, as shown in FIGS. 11A and 11B, S/D epitaxial features 146 are formed on the substrate portions 116. The S/D epitaxial feature 146 may include one or more layers of Si, SiP, SiC and SiCP for an NFET or Si, SiGe, Ge for a PFET. In some embodiments, the S/D epitaxial feature 146 includes one or more layers of Si, SiGe, and Ge for a PFET. The S/D epitaxial features 146 may grow both vertically and horizontally to form facets, which may correspond to crystalline planes of the material used for the substrate portions 116. The S/D epitaxial features 146 may be formed by an epitaxial growth method using CVD, ALD or MBE. The S/D epitaxial features 146 are in contact with the first semiconductor layers 106b and dielectric spacers 142, as shown in FIG. 11A. The S/D epitaxial features 146 may be the S/D regions. In this disclosure, a source region and a drain region are interchangeably used, and the structures thereof are substantially the same.

The S/D epitaxial features 146 may be formed by first forming an epitaxial material filling the space between adjacent dielectric features 127, followed by recessing the epitaxial materials to form the S/D epitaxial features 146. The recess of the epitaxial materials may be performed by any suitable process, such as dry etch or wet etch that selectively removes a portion of each epitaxial material but not the dielectric materials of the mask structure 136, the spacer 142, and the dielectric material 125.

As shown in FIG. 11A, the S/D epitaxial features 146 are in contact with the first semiconductor layers 106b. In some embodiments, the semiconductor device structure 100 includes a nanosheet PFET having a source epitaxial feature 146 and a drain epitaxial feature 146 both in contact with one or more first semiconductor layers 106b, or one or more channels.

Next, as shown in FIGS. 12A and 12B, an isolation layer 147 is formed on each S/D epitaxial feature 146. The isolation layer 147 may include the same material as the insulating material 118. In some embodiments, the isolation layer 147 includes an oxide that is formed by FCVD. The isolation layer 147 may be formed by first filling the space between adjacent dielectric features 127 with an isolation material using FCVD, followed by recessing the isolation material to a level below the level of the bottommost first semiconductor layers 106a. The recess of the isolation material may be performed by any suitable process, such as dry etch or wet etch that selectively removes a portion of the isolation material but not dielectric materials of the mask structure 136, the spacer 138, and the dielectric material 125.

Next, as shown in FIGS. 13A and 13B, S/D epitaxial features 149 are formed on the isolation layer 147. The isolation layer 147 may electrically isolate the S/D epitaxial feature 146 and the S/D epitaxial feature 149. The S/D epitaxial feature 149 may include one or more layers of Si, SiP, SiC and SiCP for an NFET or Si, SiGe, Ge for a PFET. In some embodiments, the S/D epitaxial feature 149 includes one or more layers of Si, SiP, SiC and SiCP for an NFET. The S/D epitaxial features 149 may be formed from the first semiconductor layers 106a. The S/D epitaxial features 149 may grow both vertically and horizontally to form facets, which may correspond to crystalline planes of the material used for the first semiconductor layers 106a. The S/D epitaxial features 149 may be formed by an epitaxial growth method using CVD, ALD or MBE. The S/D epitaxial features 149 may be the S/D regions.

As shown in FIG. 13A, the S/D epitaxial features 149 are in contact with the first semiconductor layers 106a. In some embodiments, the semiconductor device structure 100 includes a nanosheet NFET having a source epitaxial feature 149 and a drain epitaxial feature 149 both in contact with one or more first semiconductor layers 106a, or one or more channels. The S/D epitaxial features 149 may be disposed over and aligned with corresponding S/D epitaxial features 146, as shown in FIGS. 13A and 13B.

Figure 14B:
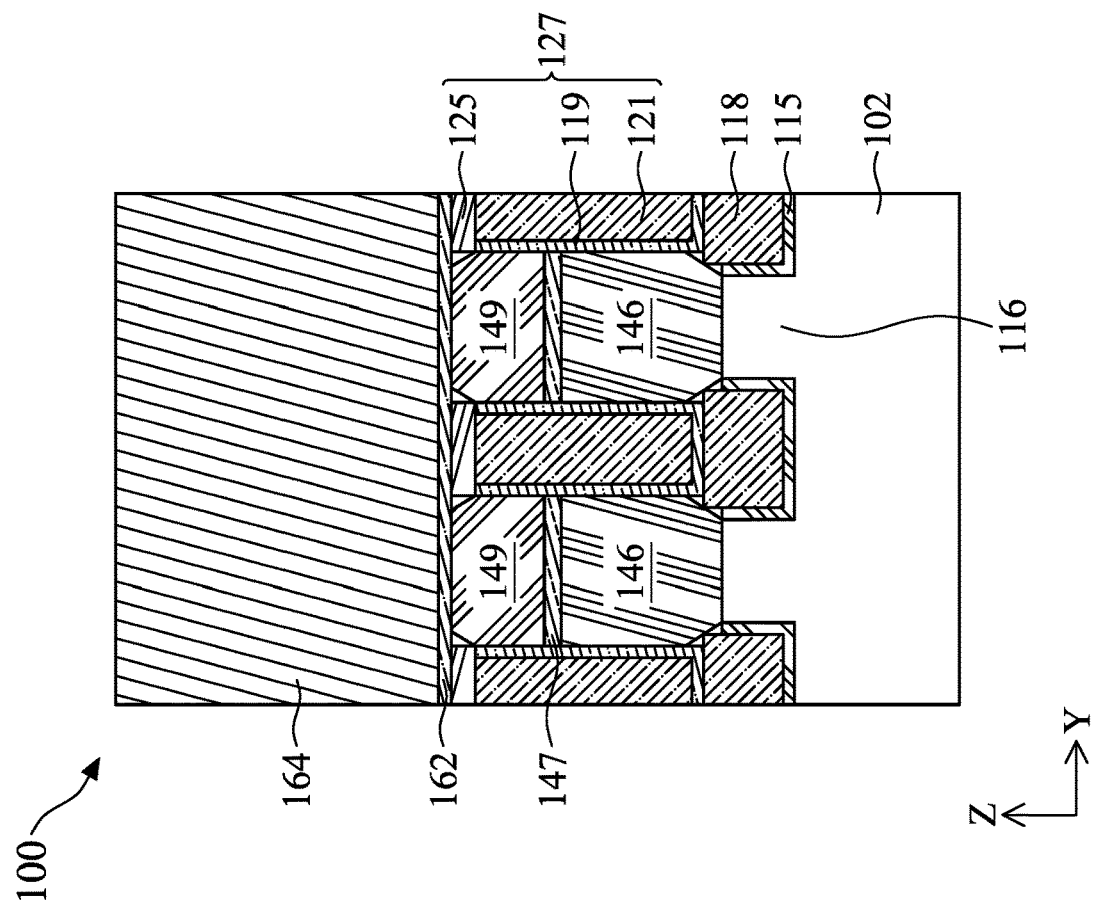
Figure 14A:
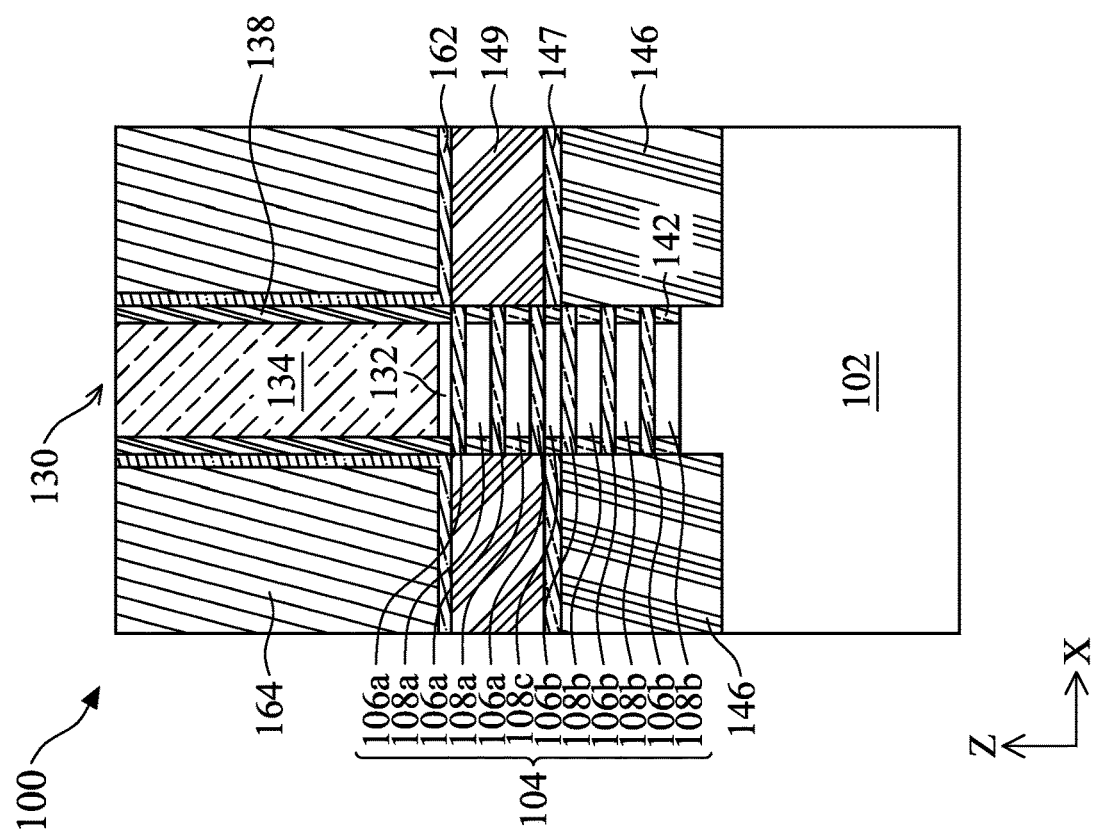

Next, as shown in FIGS. 14A and 14B, a contact etch stop layer (CESL) 162 may be formed on the S/D epitaxial features 149, the dielectric features 127, and adjacent the spacers 138. The CESL 162 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 162 may be formed by CVD, PECVD, ALD, or any suitable deposition technique. In some embodiments, the CESL 162 is a conformal layer formed by the ALD process. An interlayer dielectric (ILD) layer 164 may be formed on the CESL 162. The materials for the ILD layer 164 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique. In some embodiments, after formation of the ILD layer 164, the semiconductor device structure 100 may be subject to a thermal process to anneal the ILD layer 164.

A planarization process is performed to expose the sacrificial gate electrode layer 134, as shown in FIGS. 14A and 14B. The planarization process may be any suitable process, such as a CMP process. The planarization process removes portions of the ILD layer 164 and the CESL 162 disposed on the sacrificial gate stacks 130. The planarization process may also remove the mask structure 136.

FIG. 15B is a cross-sectional side view of a stage of manufacturing the semiconductor device structure 100 taken along line C-C of FIG. 8, in accordance with some embodiments. As shown in FIGS. 15A and 15B, the sacrificial gate electrode layer 134 and the sacrificial gate dielectric layer 132 are removed, exposing the cladding layers 117 (FIG. 7) and the stacks of semiconductor layers 104. The sacrificial gate electrode layer 134 may be first removed by any suitable process, such as dry etch, wet etch, or a combination thereof, followed by the removal of the sacrificial gate dielectric layer 132, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the spacers 138, the ILD layer 164, the dielectric material 125 of the dielectric features 127, and the CESL 162.

As shown in FIGS. 15A and 15B, the cladding layers 117 and the second semiconductor layers 108 are removed. The removal processes expose the dielectric spacers 142 and the first semiconductor layers 106. The removal process may be any suitable processes, such as dry etch, wet etch, or a combination thereof. The etch process may be a selective etch process that removes the cladding layers 117 and the second semiconductor layers 108 but not the spacers 138, the CESL 162, the dielectric material 125, and the first semiconductor layers 106. As a result, openings 160 are formed, as shown in FIGS. 15A and 15B. The portion of each first semiconductor layer 106 not covered by the dielectric spacers 142 may be exposed in the openings 160. Each first semiconductor layer 106b may be a nanosheet channel of a first nanosheet transistor, and each first semiconductor layer 106a may be a nanosheet channel of a second nanosheet transistor disposed over and aligned with the first nanosheet transistor.

Figure 16F:
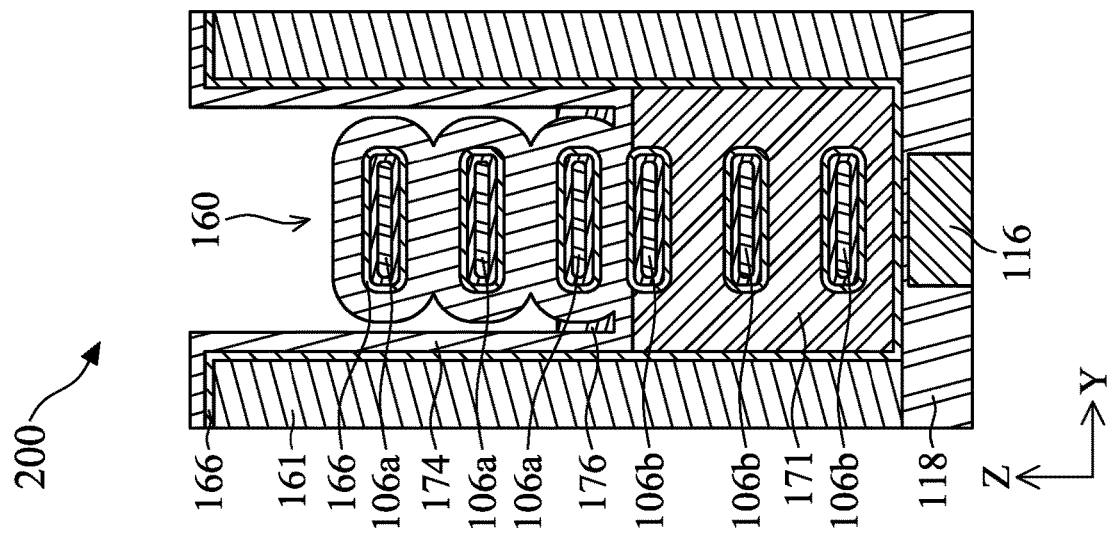

FIGS. 16A-16J are enlarged views of a region 200 of FIG. 15B showing various stages of manufacturing the semiconductor device structure, in accordance with some embodiments. The liner 115 may be omitted for clarity. As shown in FIG. 16A, in some embodiments, the dielectric features 127 are replaced with dielectric features 161. The dielectric feature 161 may include any suitable dielectric material. In some embodiments, the dielectric feature 161 includes a dielectric material similar to the dielectric material 121. An interfacial layer 159 may be formed on the substrate portion 116 and around the first semiconductor layers 106. The interfacial layer 159 may be an oxygen-containing layer, such as an oxide layer. The interfacial layer 159 may be selectively formed on the semiconductor materials of the substrate portion 116 and the first semiconductor layers 106. A gate dielectric layer 166 is formed on the interfacial layer 159, the insulating material 118, and the dielectric feature 161 (or the dielectric feature 127 shown in FIG. 15B). The gate dielectric layer 166 may include the same material as the sacrificial gate dielectric layer 132 (FIG. 14A). In some embodiments, the gate dielectric layer 166 includes a high-k dielectric material. The interfacial layer 159 and the gate dielectric layers 166 may be formed by any suitable processes, such as ALD processes.

Next, as shown in FIG. 16B, first electrode layers 168 are formed on the gate dielectric layer 166. The first electrode layers 168 are formed on the gate dielectric layer 166 to surround a portion of each first semiconductor layer 106. The first electrode layer 168 includes one or more layers of conductive material, such as polysilicon, aluminum, copper, titanium, tantalum, tungsten, cobalt, molybdenum, tantalum nitride, nickel silicide, cobalt silicide, TiN, TSN, WN, WCN, TiAl, TiTaN, TiAlN, TaN, TaCN, TaC, TaSiN, metal alloys, other suitable materials, and/or combinations thereof. The first electrode layers 168 may be formed by a conformal process, such as ALD or other suitable method. For example, the first electrode layers 168 includes a first portion 163 formed on the gate dielectric layer 166 adjacent the dielectric features 161 (or the dielectric features 127 shown in FIG. 15B) and a second portion 165 surrounding the gate dielectric layer 166 surrounding the first semiconductor layers 106.

An opening 170 may be formed between the first portion 163 and the second portion 165. The opening 170 allows an etchant to recess the first electrode layers 168 in subsequent process without over-etching or damaging the first semiconductor layers 106. Before the recessing of the first electrode layers 168, a mask material 172 is formed in the opening 170. In some embodiments, the mask material 172 fills the opening 160. The mask material 172 may be a bottom antireflective coating (BARC) material, which may be a spin-on organic material or a spin-on carbon material. The mask material 172 may be recessed to the same level as the top surface of the topmost first semiconductor layer 106b, as shown in FIG. 16C. The recess of the mask material 172 exposes portions of the first electrode layers 168 disposed above the level of the top surface of the topmost first semiconductor layer 106b. The recess of the mask material 172 may be any suitable process, such as a dry etch, a wet etch, or a combination thereof. The recess process may be a selective etch that removes portions of the mask material 172 but not the first electrode layers 168.

Next, the exposed portions of the first electrode layers 168 are removed, as shown in FIG. 16C. The portions of the first electrode layers 168 may be removed by any suitable process, such as a dry etch, a wet etch, or a combination thereof. The removal process may be a selective etch that removes the portions of the first electrode layers 168 but not the gate dielectric layer 166 and the mask material 172. As described above, in some embodiments, the etchant, such as a wet etchant, is flowed into the partially filled opening 170 as the result of recessing the mask material 172, which leads to reduced over-etching during removing the portions of the first electrode layers 168.

Figure 16E:
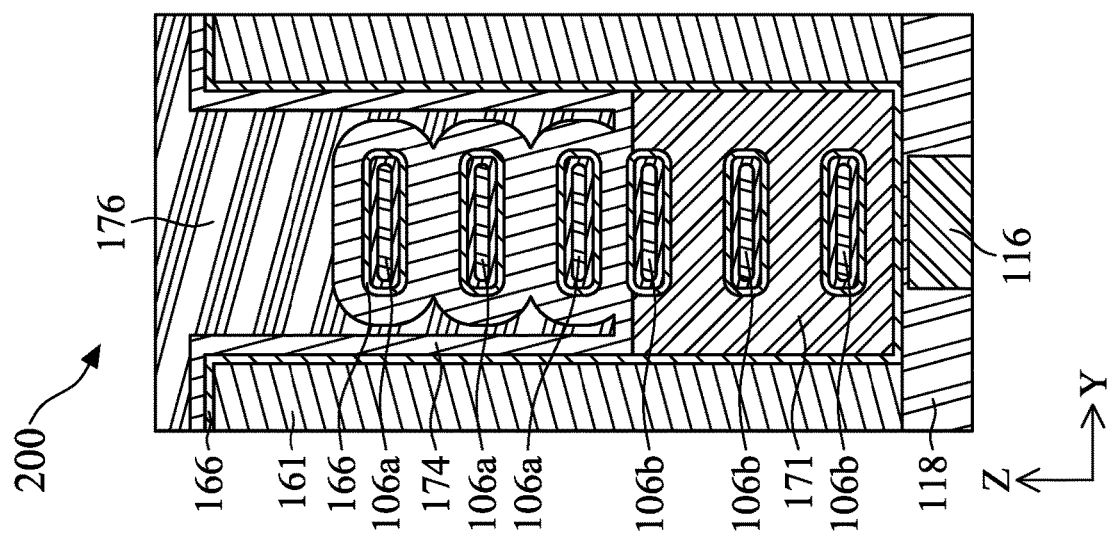
Figure 16D:
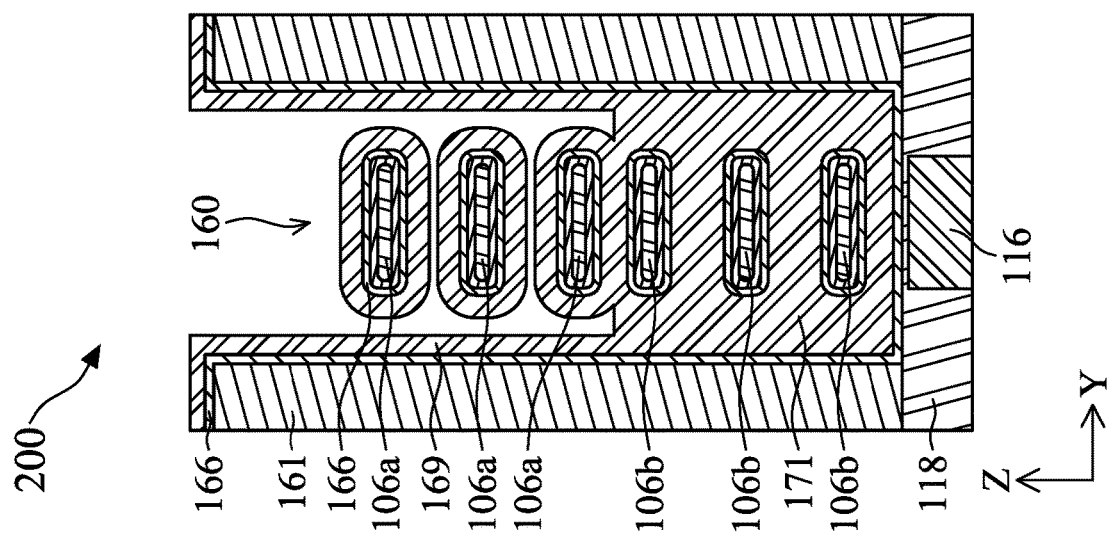

Next, as shown in FIG. 16D, the remaining mask material 172 is removed. The remaining mask material 172 may be removed by the same method as the recess of the mask material 172 described in FIG. 16C. Second electrode layers 169 are formed in the opening created by the removal of the remaining mask material 172, on portions of the gate dielectric layer 166 adjacent the dielectric features 161 (or the dielectric features 127 shown in FIG. 15B), and around the gate dielectric layers surrounding the first semiconductor layers 106a, as shown in FIG. 16D. The second electrode layers 169 may include the same material as the first electrode layers 168 and maybe formed by the same method as the first electrode layers 168. As a result, the first and second electrode layers 168, 169 fill the opening 160 to the level of the top surface of the topmost first semiconductor layer 106b. The first and second electrode layers 168, 169 disposed below the level of the top surface of the topmost first semiconductor layer 106b may be referred to as the first gate electrode layer 171. In some embodiments, the first gate electrode layer 171 is a gate electrode layer of a PFET and may include molybdenum, TaN, TiN, TSN, WCN or other suitable p-type conductive material. As shown in FIG. 16D, the first gate electrode layer 171 surrounds each of the first semiconductor layers 106b.

Next, as shown in FIG. 16E, portions of the second electrode layers 169 disposed above the level of the gate dielectric layer 166 disposed over the topmost first semiconductor layer 106b are removed. The portions of the second electrode layers 169 may be removed by the same method as the removal of the exposed portions of the first electrode layers 168 described in FIG. 16C. As a result, as shown in FIG. 16E, the first gate electrode layer 171 and the gate dielectric layer 166 disposed over the topmost first semiconductor layer 106b may have a substantially coplanar surface. Next, a first isolation layer 174 is formed on the first gate electrode layer 171 and the gate dielectric layer 166, as shown in FIG. 16E. The first isolation layer 174 may surround the first semiconductor layers 106a. The first isolation layer 174 may include a dielectric material, such as a high-k dielectric material. In some embodiments, the first isolation layer 174 includes $Al_xO_y$, $HfO_x$, $ZrO_x$, $HfAl_xO_y$, or $HfSi_xO_y$, where x and y may be any integer, such as 1, 2, 3, 4, or 5. In some embodiments, the first isolation layer 174 includes $Al_2O_3$, $HfO_2$, $ZrO_2$, $HfAl_2O_3$, $HfSiO_2$, or other suitable material. In some embodiments, the materials of the first isolation layer 174 is non-stoichiometric, and x and y may not be integers. The first isolation layer 174 may be formed by a conformal process, such as ALD or other suitable method. For example, the first isolation layer 174 includes a first portion 175 formed on the gate dielectric layer 166 adjacent the dielectric features 161 (or the dielectric features 127 shown in FIG. 15B) and a second portion 177 surrounding the gate dielectric layer 166 surrounding the first semiconductor layers 106a.

An opening may be formed between the first portion 175 and the second portion 177. The opening allows an etchant to recess the first isolation layer 174 in subsequent process without over-etching or damaging the first semiconductor layers 106a. Before the recessing of the first isolation layer 174, a mask material 176 is formed in the opening, as shown in FIG. 16E. In some embodiments, the mask material 176 fills the opening 160. The mask material 176 may include the same material as the mask material 172 and may be formed by the same method as the mask material 172. The mask material 176 may be recessed to the same level as the gate dielectric layer 166 disposed over the bottommost first semiconductor layer 106a, as shown in FIG. 16F. The opening 160 may be partially opened as the result of the recess of the mask material 176. The recess of the mask material 176 exposes portions of the first isolation layer 174 disposed above the level of the gate dielectric layer 166 disposed over the bottommost first semiconductor layer 106a. The recess of the mask material 176 may be any suitable process, such as a dry etch, a wet etch, or a combination thereof. The recess process may be a selective etch that removes portions of the mask material 176 but not the first isolation layer 174.

Figure 16I:
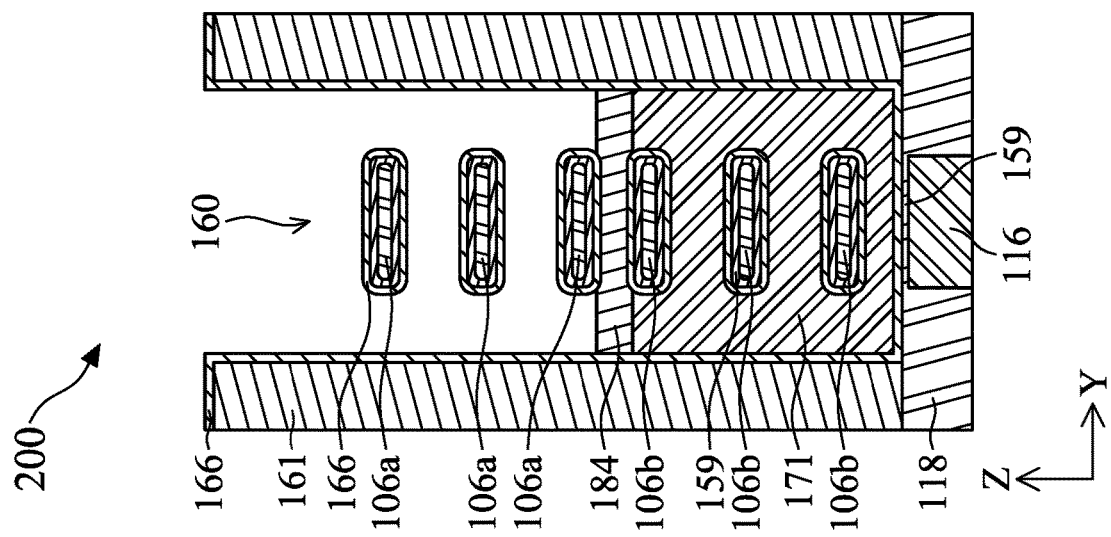
Figure 16H:
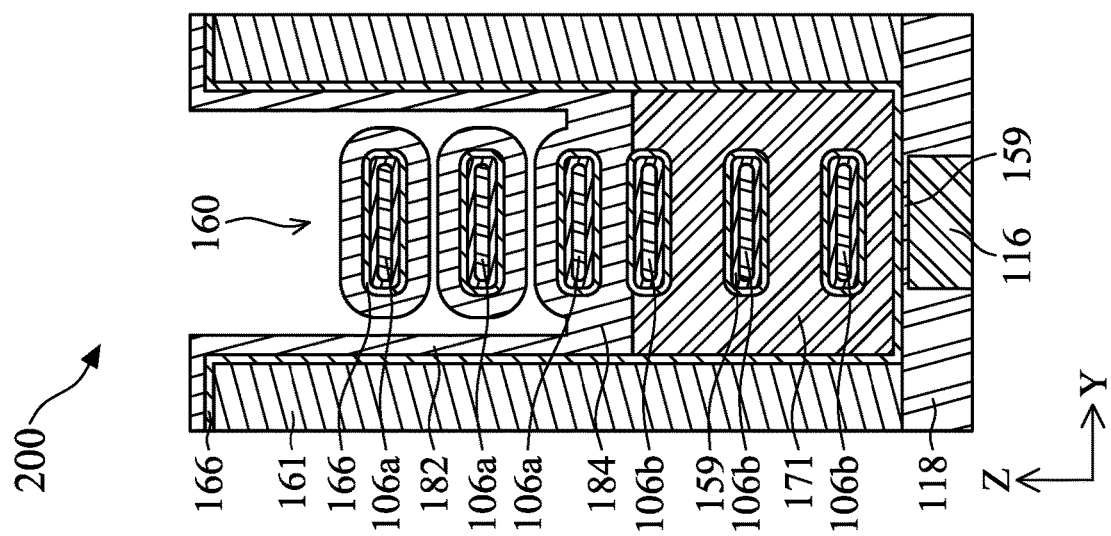
Figure 16G:
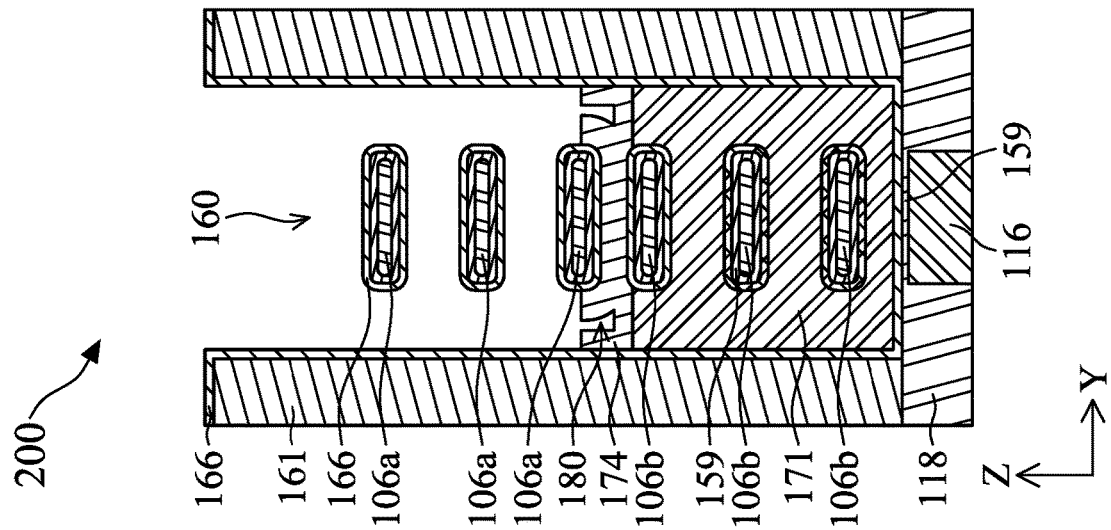

Next, the exposed portions of the first isolation layer 174 are removed, as shown in FIG. 16G. The portions of the first isolation layer 174 may be removed by any suitable process, such as a dry etch, a wet etch, or a combination thereof. The removal process may be a selective etch that removes the portions of the first isolation layer 174 but not the gate dielectric layer 166 and the mask material 176. As described above, in some embodiments, the etchant, such as a wet etchant, is flowed into the partially filled opening 160 as the result of recessing the mask material 176, which leads to reduced over-etching during the removal of the portions of the first isolation layer 174.

Next, as shown in FIG. 16G, the remaining mask material 176 is removed. The remaining mask material 176 may be removed by the same method as the recess of the mask material 176 described in FIG. 16F. Openings 180 are formed in the first isolation layer 174 as the result of the removal of the remaining mask material 176. A second isolation layer 182 is formed in the openings 180, on portions of the gate dielectric layer 166 adjacent the dielectric features 161 (or the dielectric features 127 shown in FIG. 15B), and around the gate dielectric layer 166 surrounding the first semiconductor layers 106a, as shown in FIG. 16H. The second isolation layer 182 may include the same material as the first isolation layer 174 and maybe formed by the same method as the first isolation layer 174. As a result, the first and second isolation layers 174, 182 fill the space between the top surface of the topmost first semiconductor layer 106b and the bottom surface of the bottommost first semiconductor layer 106a. The first and second isolation layers 174, 182 also extend to the gate dielectric layer 166 disposed adjacent the dielectric features 161 (or the dielectric features 127 shown in FIG. 15B). The first and second isolation layers 174, 182 disposed in the space between the top surface of the topmost first semiconductor layer 106b and the bottom surface of the bottommost first semiconductor layer 106a may be referred to as the gate isolation layer 184.

Figure 16J:
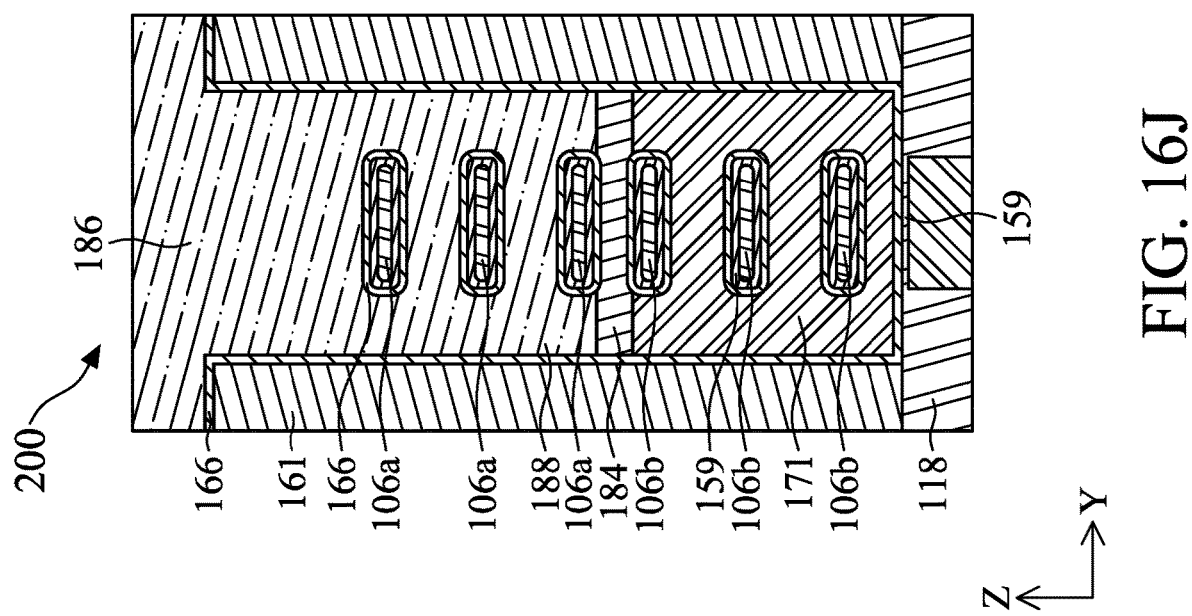

Next, as shown in FIG. 16I, portions of the second isolation layer 182 disposed above the level of the bottom surface of the bottommost first semiconductor layer 106a are removed. The portions of the second isolation layer 182 may be removed by the same method as the removal of the exposed portions of the first isolation layer 174 described in FIG. 16G. As a result, as shown in FIG. 16I, the gate isolation layer 184 is disposed between the topmost first semiconductor layer 106b and the bottommost first semi-conductor layer 106a. The gate isolation layer 184 may have a thickness ranging from about 3 nm to about 10 nm. The thickness of the gate isolation layer 184 is defined by the thickness of the second semiconductor layer 108c. The gate isolation layer 184 isolates the first gate electrode layer 171 and a second gate electrode layer 186 (FIG. 16J). Thus, if the thickness of the gate isolation layer 184 is less than about 3 nm, the gate isolation layer 184 may not be sufficient to isolate the first and second gate electrode layers 171, 186. On the other hand, if the thickness of the gate isolation layer 184 is greater than about 10 nm, the manufacturing cost is increased without significant advantage.

Next, as shown in FIG. 16J, the second gate electrode layer 186 is formed on the gate isolation layer 184 and the gate dielectric layer 166. The second gate electrode layer 186 is formed on the gate dielectric layer 166 to surround each first semiconductor layer 106a. The second gate electrode layer 186 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The second gate electrode layer 186 may be formed by PVD, CVD, ALD, electro-plating, or other suitable method. The first gate electrode layer 171 and the second gate electrode layer 186 include the same material or different materials. In some embodiments, the second gate electrode layer 186 includes an n-type gate electrode layer such as TiAlC, TaAlC, TiSiAlC, TiAl, TaSiAlC, or other suitable material, and the second gate electrode layer 186 is a gate electrode layer of an NFET. The second gate electrode layer 186 is disposed over and aligned with the first gate electrode layer 171, as shown in FIG. 16J. In some embodiments, the second gate electrode layer 186 may be recessed to a level below the top of the dielectric features 161 (or the dielectric features 127 shown in FIG. 15B). The gate isolation layer 184 is disposed between the first gate electrode layer 171 and the second gate electrode layer 186 in order to avoid metal break-down. Furthermore, the gate isolation layer 184 reduces the issue of mixed Vt boundary for NFET and PFET.

FIGS. 17A-17C are enlarged views of the region 200 of FIG. 15B showing various stages of manufacturing the semiconductor device structure 100, in accordance with alternative embodiments. FIG. 17A shows the semiconductor device structure 100 after the manufacturing stage shown in FIG. 16G. As shown in FIG. 17A, instead of forming the second isolation layer 182, which include the same material as the first isolation layer 174, a second isolation layer 188 is formed in the openings 180 (FIG. 16G), on portions of the gate dielectric layer 166 adjacent the dielectric features 161 (or the dielectric features 127 shown in FIG. 15B), and around the gate dielectric layer 166 surrounding the first semiconductor layers 106a. The second isolation layer 188 may include a dielectric material, such as a high-k dielectric material. In some embodiments, the second isolation layer 188 includes $Al_xO_y$, $HfO_x$, $ZrO_x$, $HfAl_xO_y$, or $HfSi_xO_y$, or other suitable material. The second isolation layer 188 includes a material different from the first isolation layer 174.

Next, as shown in FIG. 17B, portions of the second isolation layer 188 disposed above the level of the bottom surface of the bottommost first semiconductor layer 106a are removed. Because of the second isolation layer 188 is made of a different material from the first isolation layer 174, the removal of the portions of the second isolation layer 188 may be performed by a selective etch process, such as a selective dry or wet etch process. The selective etch process removes the portions of the second isolation layer 188 but not the first isolation layer 174. Due to the selective etch process, over-etching of the first isolation layer 174 is minimized. The portions of the second isolation layer 188 formed in the openings 180 in the first isolation layer 174 are not removed by the selective etch process. As a result, a gate isolation structure 190 including the first isolation layer 174 and second isolation layer 188 formed therein is disposed between the topmost first semiconductor layer 106b and the bottommost first semiconductor layer 106a.

The gate isolation structure 190 may have a thickness ranging from about 3 nm to about 10 nm. The thickness of the gate isolation structure 190 is defined by the thickness of the second semiconductor layer 108c. The gate isolation structure 190 isolates the first gate electrode layer 171 and the second gate electrode layer 186 (FIG. 16J). Thus, if the thickness of the gate isolation structure 190 is less than about 3 nm, the gate isolation structure 190 may not be sufficient to isolate the first and second gate electrode layers 171, 186. On the other hand, if the thickness of the gate isolation structure 190 is greater than about 10 nm, the manufacturing cost is increased without significant advantage.

Next, as shown in FIG. 17C, the second gate electrode layer 186 is formed on the gate isolation structure 190 and the gate dielectric layer 166. In some embodiments, the second gate electrode layer 186 is a gate electrode layer of an NFET. The gate isolation structure 190 is disposed between the first gate electrode layer 171 and the second gate electrode layer 186 in order to avoid metal break-down. Furthermore, the gate isolation structure 190 reduces the issue of mixed Vt boundary for NFET and PFET.

Figure 18:
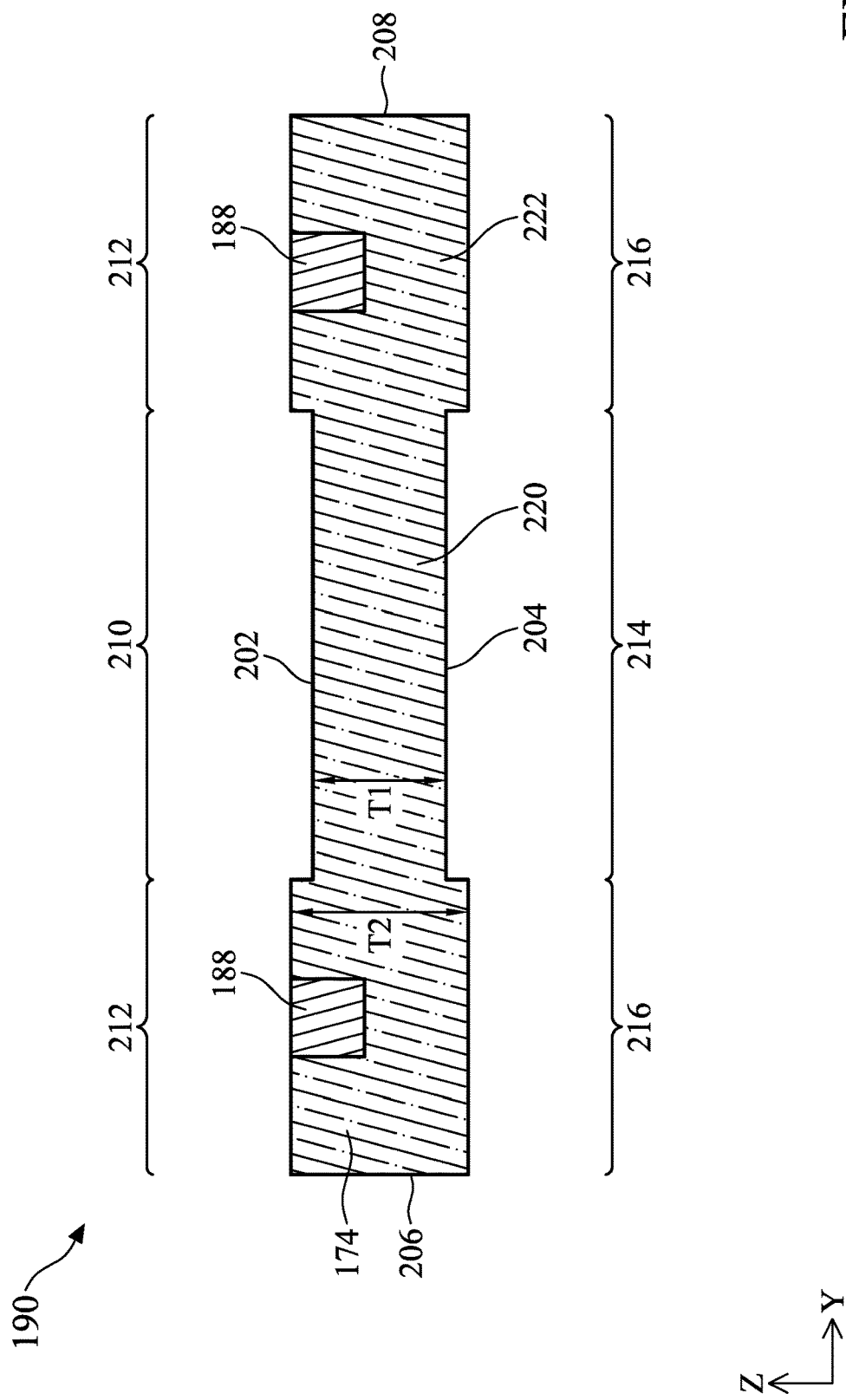
FIG. 18 is an enlarged view of a gate isolation structure, in accordance with some embodiments.

FIG. 18 is an enlarged view of the gate isolation structure 190, in accordance with some embodiments. As shown in FIG. 18, the gate isolation structure 190 includes the first isolation layer 174 and the second isolation layer 188 formed in the first isolation layer 174. The gate isolation structure 190 includes a first surface 202, a second surface 204 opposite the first surface 202, a third surface 206 connecting the first surface 202 and the second surface 204, and a fourth surface 208 opposite the third surface 206 and connecting the first surface 202 and the second surface 204. The first surface 202 includes two different materials of the first and second isolation layers 174, 188. The first surface 202 may not be planar, as shown in FIG. 18. For example, the first surface 202 includes a recessed inner portion 210 and an outer portion 212. The outer portion 212 may include two different materials, such as the material of the first isolation layer 174 and the material of the second isolation layer 188. The inner portion 210 may be in contact with the gate dielectric layer 166 disposed below the bottom surface of the bottommost first semiconductor layer 106a (FIG. 17C). The outer portion 212 maybe in contact with the second gate electrode layer 186 (FIG. 17C). For example, two different materials of the outer portion 212 may be both in contact with the second gate electrode layer 186 (FIG. 17C). The second surface 204 may not be planar, as shown in FIG. 18. For example, the second surface 204 includes a recessed inner portion 214 and an outer portion 216. The inner portion 214 may be in contact with the gate dielectric layer 166 disposed over the top surface of the topmost first semiconductor layer 106b (FIG. 17C). The outer portion 216 may be in contact with the first gate electrode layer 171 (FIG. 17C). The third and fourth surfaces 206, 208 may be in contact with the gate dielectric layer 166 disposed adjacent the dielectric features 161 (FIG. 17C) (or the dielectric features 127 shown in FIG. 15B).

In some embodiments, the gate isolation structure 190 includes an inner portion 220 and an outer portion 222, as shown in FIG. 18. The outer portion 222 may include two different materials. The inner portion 220 may have a thickness T1 and the outer portion 222 may have a thickness T2. In some embodiments, the thickness T2 is greater than the thickness T1.

In some embodiments, the gate isolation layer 184 (FIG. 16J) may have the similar shape as the gate isolation structure 190. For example, the gate isolation layer 184 may include the first, second, third, and fourth surfaces, and the first and second surfaces have recessed inner portions. In some embodiments, the gate isolation layer 184 includes the inner and outer portions having different thicknesses.

Figure 19:
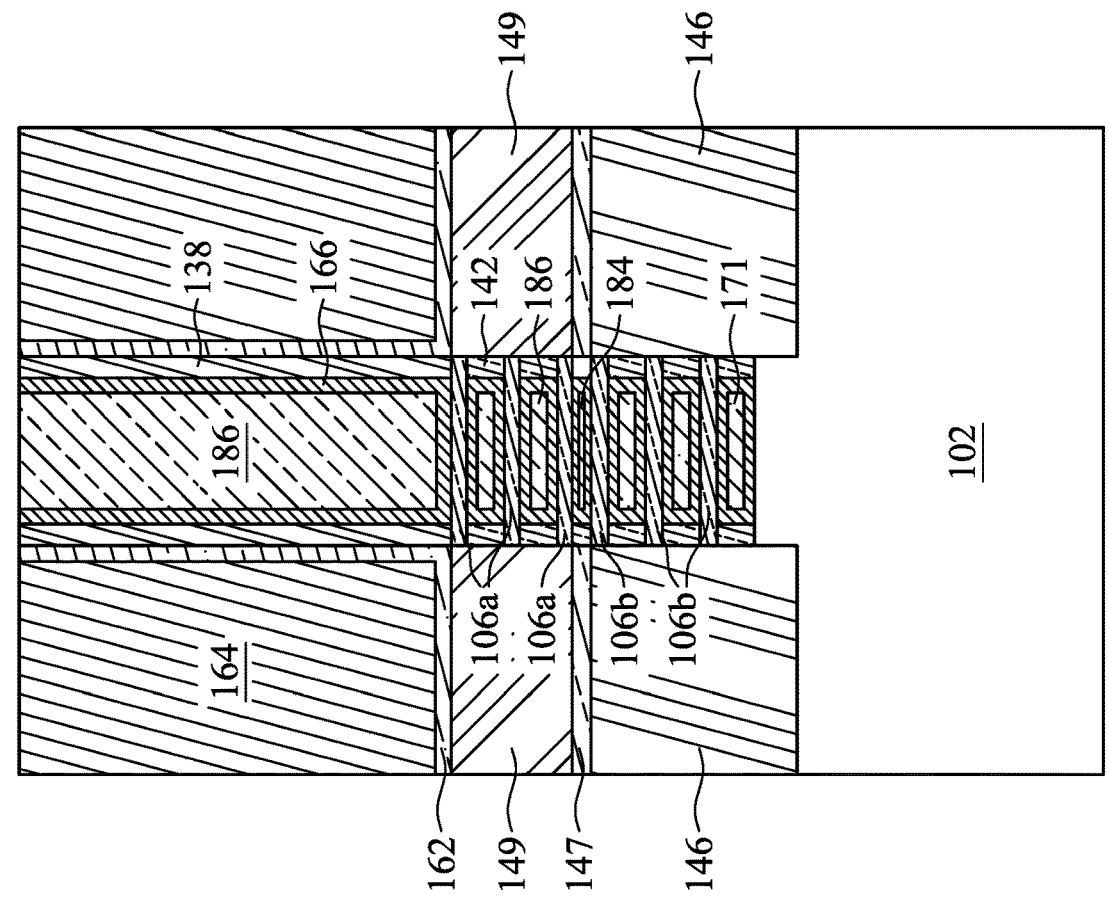
FIG. 19 is a cross-sectional side view of a stage of manufacturing the semiconductor device structure taken along line A-A of FIG. 8, in accordance with some embodiments.

FIG. 19 is a cross-sectional side view of the stage of manufacturing the semiconductor device structure 100 shown in FIG. 16J taken along line A-A of FIG. 8, in accordance with some embodiments. The interfacial layer 159 is omitted for clarity. As shown in FIG. 19, the second semiconductor layers 108a between the dielectric spacers 142 are replaced with the interfacial layer 159 (not shown), the gate dielectric layer 166, and the second gate electrode layer 186, the second semiconductor layers 108b between the dielectric spacers 142 are replaced with the interfacial layer 159 (not shown), the gate dielectric layer 166, and the first gate electrode layer 171, and the second semiconductor layer 108c between the dielectric spacers 142 is replaced with the interfacial layer 159 (not shown), the gate dielectric layer 166, and the gate isolation layer 184 (or the gate isolation structure 190 shown in FIG. 18).

It is understood that the semiconductor device structure 100 may undergo further complementary metal oxide semiconductor (CMOS) and/or back-end-of-line (BEOL) processes to form various features such as contacts/vias, interconnect metal layers, dielectric layers, passivation layers, etc. The semiconductor device structure 100 may also include backside contacts (not shown) on the backside of the substrate 102 by flipping over the semiconductor device structure 100, removing the substrate 102, and selectively connecting S/D epitaxial features 146 to a backside power rail (e.g., positive voltage VDD or negative voltage VSS) through backside contacts.

Figure 20:
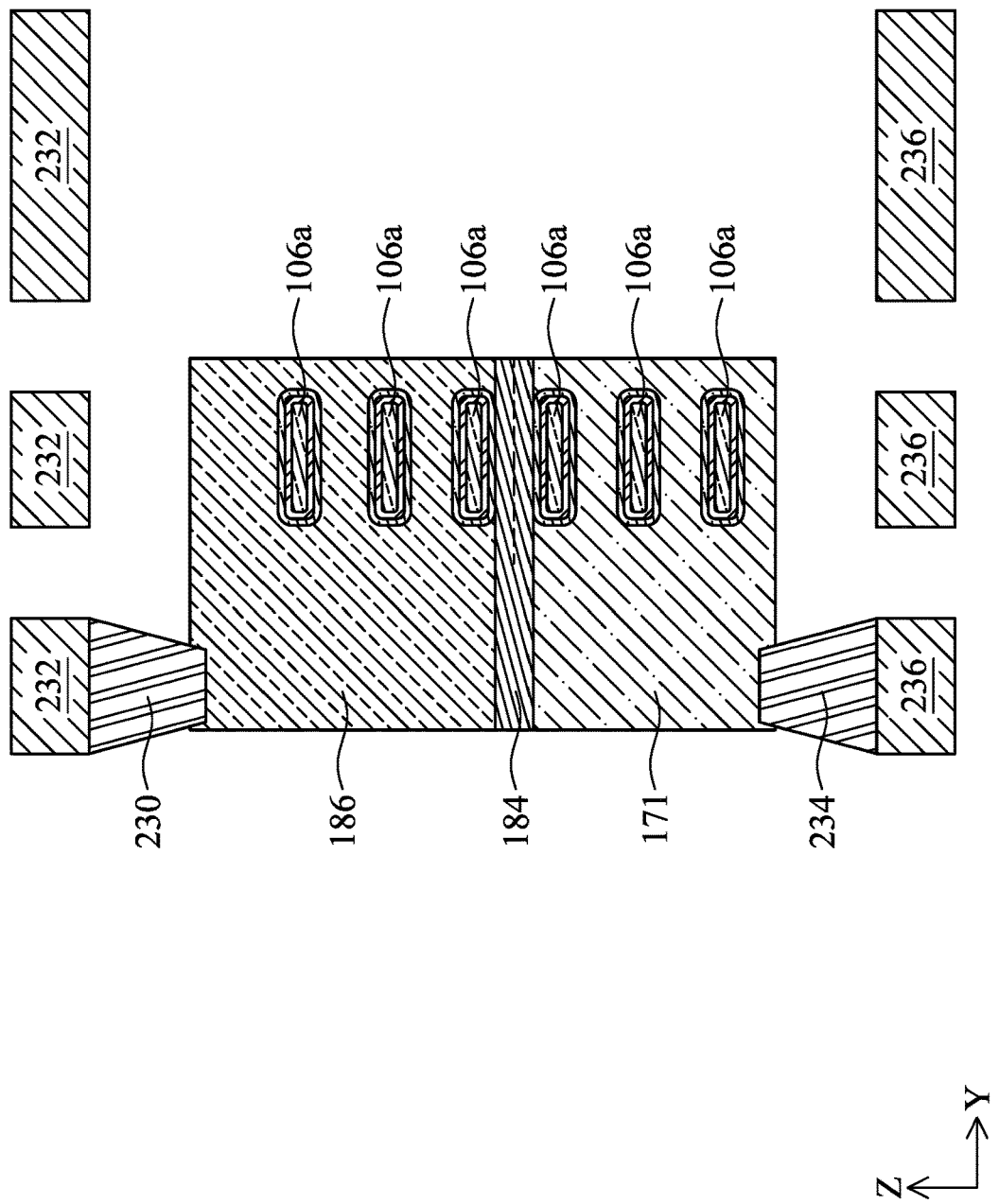
FIG. 20 is a cross-sectional side view of a stage of manufacturing the semiconductor device structure, in accordance with some embodiments.

FIG. 20 is a cross-sectional side view of a stage of manufacturing the semiconductor device structure 100, in accordance with some embodiments. As shown in FIG. 20, the first gate electrode layer 171 may be in contact with a backside contact 234, which is in contact with a conductive feature 236 of a plurality of conductive features 236. The substrate 102 is replaced with a dielectric material (not shown), and the backside contact 234 and the plurality of conductive features 236 may be embedded in the dielectric material. The contact 234 and the conductive feature 236 each may include a material having one or more of Ru, Mo, Co, Ni. W, Ti, Ta, Cu, Al, TiN and TaN, and may be formed by any suitable process, such as PVD, ECP, or CVD. The second gate electrode layer 186 may be in contact with a frontside contact 230, which is in contact with a conductive feature 232 of a plurality of conductive features 232. The frontside contact 230 and the plurality of conductive features 232 may be embedded in a dielectric material (not shown), such as an ILD layer and/or an IMD layer. The contact 230 and the conductive feature 232 each may include a material having one or more of Ru, Mo, Co, Ni. W, Ti, Ta, Cu, Al, TiN and TaN, and may be formed by any suitable process, such as PVD, ECP, or CVD. The first gate electrode layer 171 and the second gate electrode layer 186 may be independently controlled through the contact 230/conductive feature 232 and the contact 236/conductive feature 236, respectively.

The present disclosure provides a semiconductor device structure 100 including a CFET having a first FET and a second FET disposed over and aligned with the first FET. The first FET includes a first gate electrode layer 171, and the second FET includes a second gate electrode layer 186. The first gate electrode layer 171 is separated from the second gate electrode layer 186 by the gate isolation layer 184 or the gate isolation structure 190. Some embodiments may achieve advantages. For example, the gate isolation layer 184 or the gate isolation structure 190 is disposed between the first gate electrode layer 171 and the second gate electrode layer 186 in order to avoid metal break-down and to reduce the issue of mixed Vt boundary for NFET and PFET.

An embodiment is a semiconductor device structure. The structure includes a first gate electrode layer, a second gate electrode layer disposed over and aligned with the first gate electrode layer, and a gate isolation structure disposed between the first gate electrode layer and the second gate electrode layer. The gate isolation structure includes a first surface and a second surface opposite the first surface. At least a portion of the first surface is in contact with the first gate electrode layer. The second surface includes a first material and a second material different from the first material, and at least a portion of the second surface is in contact with the second gate electrode layer.

Another embodiment is a method. The method includes forming a first plurality of semiconductor layers and a second plurality of semiconductor layers, and the second plurality of semiconductor layers is disposed over and aligned with the first plurality of semiconductor layers. The method further includes forming a first dielectric feature and a second dielectric feature, and the first and second plurality of semiconductor layers are disposed between the first dielectric feature and the second dielectric feature. The method further includes forming a first electrode layer. The first electrode layer includes a first portion disposed adjacent the first and second dielectric features and a second portion surrounding at least a portion of each of the first plurality of semiconductor layers and at least a portion of each of the second plurality of semiconductor layers, and an opening is formed between the first portion and the second portion of the first electrode layer. The method further includes forming a mask material in the opening, removing a portion of the mask material to expose portions of the first and second portions of the first electrode layer, removing the exposed portions of the first and second portions of the first electrode layer, removing a remaining mask material disposed between a remaining first portion and a remaining second portion of the first electrode layer, depositing a second electrode layer between the remaining first portion and the remaining second portion to form a first gate electrode layer, forming a gate isolation layer in contact with the first gate electrode layer, and forming a second gate electrode layer in contact with the gate isolation layer.

A further embodiment is a method. The method includes forming a first plurality of semiconductor layers and a second plurality of semiconductor layers. The second plurality of semiconductor layers is disposed over and aligned with the first plurality of semiconductor layers. The method further includes forming a first dielectric feature and a second dielectric feature, and the first and second plurality of semiconductor layers are disposed between the first dielectric feature and the second dielectric feature. The method further includes forming a first gate electrode layer around at least one semiconductor layer of the first plurality of semiconductor layers and forming a gate isolation structure in contact with the first gate electrode layer. The forming the gate isolation structure includes forming a first isolation layer, and the first isolation layer includes a first portion disposed adjacent the first and second dielectric features and a second portion surrounding at least a portion of each of the second plurality of semiconductor layers. An opening is formed between the first portion and the second portion of the first isolation layer. The method further includes forming a mask material in the opening, removing a portion of the mask material to expose portions of the first and second portions of the first isolation layer, removing the exposed portions of the first and second portions of the first isolation layer, removing a remaining mask material disposed between a remaining first portion and a remaining second portion of the first isolation layer, and forming a second isolation layer between the remaining first portion and the remaining second portion of the first isolation layer. The method further includes forming a second gate electrode layer in contact with the gate isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A method, comprising:
forming a first plurality of semiconductor layers and a second plurality of semiconductor layers, wherein the second plurality of semiconductor layers is disposed over and aligned with the first plurality of semiconductor layers;
forming a first dielectric feature and a second dielectric feature, wherein the first and second pluralities of semiconductor layers are disposed between the first dielectric feature and the second dielectric feature;
forming a first electrode layer, wherein the first electrode layer comprises a first portion disposed adjacent the first and second dielectric features and a second portion surrounding at least a portion of each of the first plurality of semiconductor layers and at least a portion of each of the second plurality of semiconductor layers, and wherein an opening is formed between the first portion and the second portion of the first electrode layer;
forming a mask material in the opening;
removing a portion of the mask material to expose portions of the first and second portions of the first electrode layer;
removing the exposed portions of the first and second portions of the first electrode layer;
removing a remaining mask material disposed between a remaining first portion and a remaining second portion of the first electrode layer;
depositing a second electrode layer between the remaining first portion and the remaining second portion to form a first gate electrode layer;

forming a gate isolation layer in contact with the first gate electrode layer; and forming a second gate electrode layer in contact with the gate isolation layer.

2. The method of claim 1, further comprising:

forming a first and second source/drain epitaxial features, wherein the first and second epitaxial features are in contact with the first plurality of semiconductor layers; and forming a third and a fourth source/drain epitaxial features, wherein the third source/drain epitaxial feature is formed on the first source/drain epitaxial feature and the fourth source/drain epitaxial feature is formed on the second source/drain epitaxial feature.

3. The method of claim 2, further comprising forming a first isolation layer and a second isolation layer, wherein the first isolation layer is formed on the first source/drain epitaxial feature and the second isolation layer is formed on the second source/drain epitaxial feature, and wherein the third source/drain epitaxial feature is formed on the first isolation layer and the fourth source/drain epitaxial feature is formed on the second isolation layer.

4. The method of claim 1, further comprising forming a gate dielectric layer on the first and second dielectric features and surrounding at least a portion of each of the first and second pluralities of semiconductor layers, wherein the first and second gate electrode layers are formed on the gate dielectric layer.

5. A method, comprising:

forming a first plurality of semiconductor layers and a second plurality of semiconductor layers, wherein the second plurality of semiconductor layers is disposed over and aligned with the first plurality of semiconductor layers;

forming a first dielectric feature and a second dielectric feature, wherein the first and second pluralities of semiconductor layers are disposed between the first dielectric feature and the second dielectric feature;

forming a first gate electrode layer around at least one semiconductor layer of the first plurality of semiconductor layers;

forming a gate isolation structure in contact with the first gate electrode layer, comprising:

forming a first isolation layer, wherein the first isolation layer comprises a first portion disposed adjacent the first and second dielectric features and a second portion surrounding at least a portion of each of the second plurality of semiconductor layers, and wherein an opening is formed between the first portion and the second portion of the first isolation layer;

forming a mask material in the opening;

removing a portion of the mask material to expose portions of the first and second portions of the first isolation layer;

removing the exposed portions of the first and second portions of the first isolation layer;

removing a remaining mask material disposed between a remaining first portion and a remaining second portion of the first isolation layer; and forming a second isolation layer between the remaining first portion and the remaining second portion; and forming a second gate electrode layer in contact with the gate isolation structure.

6. The method of claim 5, wherein the first isolation layer and the second isolation layer comprise a same material.

7. The method of claim 5, wherein the first isolation layer and the second isolation layer comprise different materials.

8. The method of claim 5, wherein the first gate electrode layer and the second gate electrode layer comprise different materials.

9. The method of claim 5, further comprising:

forming a backside contact in contact with the first gate electrode layer; and forming a frontside contact in contact with the second gate electrode layer.

10. A method, comprising:

forming a first semiconductor layer and a second semiconductor layer, wherein the second semiconductor layer is disposed over and aligned with the first semiconductor layer;

forming a first gate electrode layer around the first semiconductor layer;

forming a gate isolation structure in contact with the first gate electrode layer, comprising:

depositing a first isolation layer;

removing portions of the first isolation layer, wherein a remaining portion of the first isolation layer is located at a level below a top surface of the second semiconductor layer;

depositing a second isolation layer on the remaining portion of the first isolation layer; and removing portions of the second isolation layer; and forming a second gate electrode layer in contact with the gate isolation structure.

11. The method of claim 10, further comprising a third semiconductor layer disposed between the first and second semiconductor layers.

12. The method of claim 11, wherein the gate isolation structure is disposed between the second and third semiconductor layers.

13. The method of claim 10, wherein the first isolation layer and the second isolation layer comprise different materials.

14. The method of claim 10, wherein the first isolation layer comprises a first portion and a second portion, wherein a first opening is between the first and second portions.

15. The method of claim 14, further comprising depositing a mask material in the first opening between the first and second portions of the first isolation layer.

16. The method of claim 15, further comprising recessing the mask material, wherein a remaining mask material has a top surface located at a level above the top surface of the second semiconductor layer.

17. The method of claim 16, further comprising removing the remaining mask material to form a second opening in the remaining portion of the first isolation layer.

18. The method of claim 17, wherein the second isolation layer is deposited in the second opening.

19. The method of claim 10, wherein the portions of the first isolation layer are removed by a first wet etch process.

20. The method of claim 19, wherein the portions of the second isolation layer are removed by a second wet etch process.

* * * * *